(12) United States Patent
Sorin et al.

(10) Patent No.: US 11,579,523 B2
(45) Date of Patent: Feb. 14, 2023

(54) METHOD AND SYSTEM FOR FABRICATING GLASS-BASED NANOSTRUCTURES ON LARGE-AREA PLANAR SUBSTRATES, FIBERS, AND TEXTILES

(71) Applicant: ECOLE POLYTECHNIQUE FEDERALE DE LAUSANNE (EPFL), Lausanne (CH)

(72) Inventors: Fabien Sorin, Saint-Sulpice (CH); Louis Martin-Monier, Lausanne (CH); Alexis Page, Renens (CH); Tapajyoti Dasgupta, Ecublens (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 347 days.

(21) Appl. No.: 16/784,294

(22) Filed: Feb. 7, 2020

(65) Prior Publication Data

US 2020/0257194 A1  Aug. 13, 2020

Related U.S. Application Data

(60) Provisional application No. 62/802,725, filed on Feb. 8, 2019.

(51) Int. Cl.
| | |
|---|---|
| *G03F 7/00* | (2006.01) |
| *B29C 59/02* | (2006.01) |
| *B81C 1/00* | (2006.01) |
| *G01N 21/65* | (2006.01) |
| *G01N 21/41* | (2006.01) |

(Continued)

(52) U.S. Cl.
CPC .......... *G03F 7/0002* (2013.01); *B29C 59/022* (2013.01); *B81C 1/0046* (2013.01); *G01N 21/41* (2013.01); *G01N 21/658* (2013.01); *B29C 59/04* (2013.01); *B29C 2059/023* (2013.01); *B81C 2201/015* (2013.01); *B82Y 20/00* (2013.01);
(Continued)

(58) Field of Classification Search
CPC ... B29C 59/022; G03F 7/0002; G01N 21/658; G01N 21/41; B81C 1/0046
See application file for complete search history.

(56) References Cited

U.S. PATENT DOCUMENTS

| | | | |
|---|---|---|---|
| 3,659,915 A | 5/1972 | Maurer et al. | |
| 4,426,420 A | 1/1984 | Likhyani | |

(Continued)

FOREIGN PATENT DOCUMENTS

| | | |
|---|---|---|
| DE | 3244778 A1 | 6/1983 |
| JP | H0274667 A | 3/1990 |

(Continued)

OTHER PUBLICATIONS

Tao, G., Stolyarov, A. M., & Abouraddy, A. F. (2012). Multimaterial fibers. International Journal of Applied Glass Science, 3(4), 349-368.

(Continued)

*Primary Examiner* — Mathieu D Vargot
(74) *Attorney, Agent, or Firm* — Nixon & Vanderhye P.C.

(57) ABSTRACT

A method for manufacturing glass-based micro- and nanostructure comprising the step of dewetting a thin-film glass layer on a textured substrate to form the micro- and nanostructure from the thin-film glass layer.

21 Claims, 22 Drawing Sheets

(51) Int. Cl.
  *B82Y 40/00*   (2011.01)
  *B29C 59/04*   (2006.01)
  *B82Y 20/00*   (2011.01)
  *B82Y 30/00*   (2011.01)
(52) U.S. Cl.
  CPC ............... *B82Y 30/00* (2013.01); *B82Y 40/00* (2013.01); *G01N 2201/08* (2013.01)

(56) References Cited

U.S. PATENT DOCUMENTS

| | | | |
|---|---|---|---|
| 4,504,300 | A | 3/1985 | Gauthier et al. |
| 5,984,747 | A | 11/1999 | Bhagavatula et al. |
| 7,292,758 | B2 | 11/2007 | Bayindir et al. |
| 7,295,734 | B2 | 11/2007 | Bayindir et al. |
| 7,442,316 | B2* | 10/2008 | Jeong ............... B82Y 40/00 264/319 |
| 2003/0001082 | A1 | 1/2003 | Duncan et al. |
| 2005/0286847 | A1 | 12/2005 | Arimondi et al. |
| 2010/0221969 | A1 | 9/2010 | Chen |
| 2010/0290781 | A1 | 11/2010 | Overton |
| 2011/0123162 | A1 | 5/2011 | Molin et al. |
| 2012/0027987 | A1 | 2/2012 | Poulakis |
| 2012/0301093 | A1 | 11/2012 | Sillard |
| 2013/0202888 | A1 | 8/2013 | Abouraddy et al. |
| 2015/0014891 | A1* | 1/2015 | Amatucci ............... C23F 4/02 264/447 |
| 2016/0251756 | A1* | 9/2016 | Lansalot-Matras ............... H01L 21/02271 427/252 |
| 2016/0270388 | A1 | 9/2016 | Lai et al. |
| 2018/0003859 | A1 | 1/2018 | Morasse |
| 2018/0088258 | A1 | 3/2018 | Yamamoto et al. |
| 2018/0327931 | A1 | 11/2018 | Sorin et al. |
| 2019/0047240 | A1 | 2/2019 | Sorin et al. |

FOREIGN PATENT DOCUMENTS

| | | |
|---|---|---|
| KR | 20120129040 A | 11/2012 |
| WO | WO 2008/057431 A2 | 5/2008 |
| WO | WO 2012/112198 A2 | 8/2012 |
| WO | WO 2014/047660 A1 | 3/2014 |
| WO | WO 2014/130917 A1 | 8/2014 |

OTHER PUBLICATIONS

Abouraddy, A. F., Bayindir, M., Benoit, G., Hart, S. D., Kuriki, K., Orf, N., . . . & Fink, Y. (2007). Towards multimaterial multifunctional fibres that see, hear, sense and communicate. Nature materials, 6(5), 336-347.
Albella, P., Alcaraz de la Osa, R., Moreno, F., & Maier, S. A. (2014). Electric and magnetic field enhancement with ultralow heat radiation dielectric nanoantennas: considerations for surface-enhanced spectroscopies. Acs Photonics, 1(6), 524-529.
Alexander Schmidt, M., Argyros, A., & Sorin, F. (2016). Hybrid Optical Fibers—An Innovative Platform for In-Fiber Photonic Devices. Advanced Optical Materials, 4(1), 13-36.
Arbabi, A., Horie, Y., Bagheri, M., & Faraon, A. (2015). Dielectric metasurfaces for complete control of phase and polarization with subwavelength spatial resolution and high transmission. Nature nanotechnology, 10(11), 937.
Arbabi, E., Arbabi, A., Kamali, S. M., Horie, Y., Faraji-Dana, M., & Faraon, A. (2018). MEMS-tunable dielectric metasurface lens. Nature communications, 9(1), 1-9.
Babicheva, V. E., & Evlyukhin, A. B. (2017). Resonant lattice Kerker effect in metasurfaces with electric and magnetic optical responses. Laser & Photonics Reviews, 11(6), 1700132.
Backholm, M., Benzaquen, M., Salez, T., Raphaël, E., & Dalnoki-Veress, K. (2014). Capillary levelling of a cylindrical hole in a viscous film. Soft Matter, 10(15), 2550-2558.
Banaei, E. H., & Abouraddy, A. F. (2015). Design of a polymer optical fiber luminescent solar concentrator. Progress in Photovoltaics: Research and Applications, 23(4), 403-416.
Bontempi, N., Chong, K. E., Orton, H. W., Staude, I., Choi, D. Y., Alessandri, I., . . . & Neshev, D. N. (2017). Highly sensitive biosensors based on all-dielectric nanoresonators. Nanoscale, 9(15), 4972-4980.
Brudieu, B., Bris, A. L., Teisseire, J., Guillemot, F., Dantelle, G., Misra, S., . . . & Gacoin, T. (2014). Sol-gel route toward efficient and robust distributed Bragg reflectors for light management applications. Advanced Optical Materials, 2(11), 1105-1112.
Cho, Y., Kwon, S., Seo, J. W., Kim, J. G., Cho, J. W., Park, J. W., . . . & Lee, S. (2009). Development of large area nano imprint technology by step and repeat process and pattern stitching technique. Microelectronic Engineering, 86(12), 2417-2422.
De Gennes, P. G., Brochard-Wyart, F., & Quéré, D. (2013). Capillarity and wetting phenomena: drops, bubbles, pearls, waves. Springer Science & Business Media.
Decker, M., Staude, I., Falkner, M., Dominguez, J., Neshev, D. N., Brener, I., . . . & Kivshar, Y. S. (2015). High-efficiency dielectric Huygens'surfaces. Advanced Optical Materials, 3(6), 813-820.
Deng, D. S., Nave, J. C., Liang, X., Johnson, S. G., & Fink, Y. (2011). Exploration of in-fiber nanostructures from capillary instability. Optics express, 19(17), 16273-16290.
Eggleton, B. J., Luther-Davies, B., & Richardson, K. (2011). Chalcogenide photonics. Nature photonics, 5(3), 141.
Fan, J. A., Wu, C., Bao, K., Bao, J., Bardhan, R., Halas, N. J., . . . & Capasso, F. (2010). Self-assembled plasmonic nanoparticle clusters. science, 328(5982), 1135-1138.
Flauraud, V., Mastrangeli, M., Bernasconi, G. D., Butet, J., Alexander, D. T., Shahrabi, E., . . . & Brugger, J. (2017). Nanoscale topographical control of capillary assembly of nanoparticles. Nature nanotechnology, 12(1), 73.
Gupta, T. D., Maurin, I., Rowe, A. C. H., & Gacoin, T. (2017). Ultrafine tuning of the metal volume fraction in silver/silicate nanocomposites near the percolation threshold. Nanoscale, 9(10), 3504-3511.
Hosseini, P., Wright, C. D., & Bhaskaran, H. (2014). An optoelectronic framework enabled by low-dimensional phase-change films. Nature, 511(7508), 206-211.
International Search Report for PCT/IB2017/050749 dated May 22, 2017.
International Search Report dated Apr. 13, 2017 for PCT/EP2016/078341.
Jahani, S., & Jacob, Z. (2016). All-dielectric metamaterials. Nature nanotechnology, 11(1), 23.
Kao, K. C., & Hockham, G. A. (1986). Dielectric-fibre surface waveguides for optical frequencies. IEE Proceedings J (Optoelectronics), 133(3), 191-198.
Khorasaninejad, M., Chen, W. T., Devlin, R. C., Oh, J., Zhu, A. Y., & Capasso, F. (2016). Metalenses at visible wavelengths: Diffraction-limited focusing and subwavelength resolution imaging. Science, 352(6290), 1190-1194.
Koenderink, A. F., Alu, A., & Polman, A. (2015). Nanophotonics: shrinking light-based technology. Science, 348(6234), 516-521.
Kohoutek, T., Orava, J., Greer, A. L., & Fudouzi, H. (2013). Sub-micrometer soft lithography of a bulk chalcogenide glass. Optics express, 21(8), 9584-9591.
Kuznetsov, A. I., Miroshnichenko, A. E., Brongersma, M. L., Kivshar, Y. S., & Luk'yanchuk, B. (2016). Optically resonant dielectric nanostructures. Science, 354(6314), aag2472.
Le Bris, A., Maloum, F., Teisseire, J., & Sorin, F. (2014). Self-organized ordered silver nanoparticle arrays obtained by solid state dewetting. Applied Physics Letters, 105(20), 203102.
Li, L., Lin, H., Qiao, S., Huang, Y. Z., Li, J. Y., Michon, J., . . . & Richardson, K. (2018). Monolithically integrated stretchable photonics. Light: Science & Applications, 7(2), 17138-17138.
Li, L., Lin, H., Qiao, S., Zou, Y., Danto, S., Richardson, K., . . . & Hu, J. (2014). Integrated flexible chalcogenide glass photonic devices. Nature Photonics, 8(8), 643-649.
Limonov, M. F., Rybin, M. V., Poddubny, A. N., & Kivshar, Y. S. (2017). Fano resonances in photonics. Nature Photonics, 11(9), 543-554.

(56) References Cited

OTHER PUBLICATIONS

Lin, D., Fan, P., Hasman, E., & Brongersma, M. L. (2014). Dielectric gradient metasurface optical elements. science, 345(6194), 298-302.

Lin, Q. Y., Mason, J. A., Li, Z., Zhou, W., O'Brien, M. N., Brown, K. A., . . . & Aydin, K. (2018). Building superlattices from individual nanoparticles via template-confined DNA-mediated assembly. Science, 359(6376), 669-672.

Liu, J. G., & Ueda, M. (2009). High refractive index polymers: fundamental research and practical applications. Journal of Materials Chemistry, 19(47), 8907-8919.

Liu, S., Sinclair, M. B., Saravi, S., Keeler, G. A., Yang, Y., Reno, J., . . . & Brener, I. (2016). Resonantly enhanced second-harmonic generation using III-V semiconductor all-dielectric metasurfaces. Nano letters, 16(9), 5426-5432.

Maguid, E., Yulevich, I., Veksler, D., Kleiner, V., Brongersma, M. L., & Hasman, E. (2016). Photonic spin-controlled multifunctional shared-aperture antenna array. Science, 352(6290), 1202-1206.

Ok, J. G., Shin, Y. J., Park, H. J., & Guo, L. J. (2015). A step toward next-generation nanoimprint lithography: extending productivity and applicability. Applied Physics A, 121(2), 343-356.

Oron, A., Davis, S. H., & Bankoff, S. G. (1997). Long-scale evolution of thin liquid films. Reviews of modern physics, 69(3), 931.

Parry, M., Komar, A., Hopkins, B., Campione, S., Liu, S., Miroshnichenko, A. E., . . . & Neshev, D. N. (2017). Active tuning of high-Q dielectric metasurfaces. Applied Physics Letters, 111(5), 053102.

Rotenberg, N., and L. Kuipers. "Mapping nanoscale light fields." Nature Photonics 8.12 (2014): 919.

Russell, P. (2003). Photonic crystal fibers. science, 299(5605), 358-362.

Sharma, A., & Khanna, R. (1998). Pattern formation in unstable thin liquid films. Physical Review Letters, 81(16), 3463.

She, A., Zhang, S., Shian, S., Clarke, D. R., & Capasso, F. (2018). Adaptive metalenses with simultaneous electrical control of focal length, astigmatism, and shift. Science advances, 4(2), eaap9957.

Solmaz, M., Park, H., Madsen, C. K., & Cheng, X. (2008). Patterning chalcogenide glass by direct resist-free thermal nanoimprint. Journal of Vacuum Science & Technology B: Microelectronics and Nanometer Structures Processing, Measurement, and Phenomena, 26(2), 606-610.

Stillwagon, L. E., & Larson, R. G. (1988). Fundamentals of topographic substrate leveling. Journal of applied physics, 63(11), 5251-5258.

Style, R. W., Hyland, C., Boltyanskiy, R., Wettlaufer, J. S., & Dufresne, E. R. (2013). Surface tension and contact with soft elastic solids. Nature communications, 4(1), 1-6.

Thompson, C. V. (2012). Solid-state dewetting of thin films. Annual Review of Materials Research, 42, 399-434.

Tverjanovich, A. S. (2003). Temperature dependence of the viscosity of chalcogenide glass-forming melts. Glass physics and chemistry, 29(6), 532-536.

Vigderman, L., Khanal, B. P., & Zubarev, E. R. (2012). Functional gold nanorods: synthesis, self-assembly, and sensing applications. Advanced materials, 24(36), 4811-4841.

Volodin, P., & Kondyurin, A. (2008). Dewetting of thin polymer film on rough substrate: I. Theory. Journal of Physics D: Applied Physics, 41(6), 065306.

Wang, K. X., Yu, Z., Liu, V., Cui, Y., & Fan, S. (2012). Absorption enhancement in ultrathin crystalline silicon solar cells with antireflection and light-trapping nanocone gratings. Nano letters, 12(3), 1616-1619.

Wang, L., Kruk, S., Koshelev, K., Kravchenko, I., Luther-Davies, B., & Kivshar, Y. (2018). Nonlinear wavefront control with all-dielectric metasurfaces. Nano letters, 18(6), 3978-3984.

Wang, Q., Rogers, E. T., Gholipour, B., Wang, C. M., Yuan, G., Teng, J., & Zheludev, N. I. (2016). Optically reconfigurable metasurfaces and photonic devices based on phase change materials. Nature Photonics, 10(1), 60.

Written Opinion of the International Search Authority for PCT/EP2016/078341 dated Apr. 13, 2017.

Written Opinion of the ISA for PCT/IB2017/050749 dated May 22, 2017.

Xie, R., Karim, A., Douglas, J. F., Han, C. C., & Weiss, R. A. (1998). Spinodal dewetting of thin polymer films. Physical Review Letters, 81(6), 1251.

Yan, W., Page, A., Nguyen-Dang, T., Qu, Y., Sordo, F., Wei, L., & Sorin, F. (2019). Advanced multimaterial electronic and optoelectronic fibers and textiles. Advanced materials, 31(1), 1802348.

Yan, W., Qu, Y., Gupta, T. D., Darga, A., Nguyên, D. T., Page, A. G., . . . & Sorin, F. (2017). Semiconducting nanowire-based optoelectronic fibers. Advanced Materials, 29(27), 1700681.

Yang, Y., Kravchenko, I. I., Briggs, D. P., & Valentine, J. (2014). All-dielectric metasurface analogue of electromagnetically induced transparency. Nature communications, 5(1), 1-7.

Yang, Y., Wang, W., Boulesbaa, A., Kravchenko, I. I., Briggs, D. P., Puretzky, A., . . . & Valentine, J. (2015). Nonlinear Fano-resonant dielectric metasurfaces. Nano letters, 15(11), 7388-7393.

Yanik, A. A., Cetin, A. E., Huang, M., Artar, A., Mousavi, S. H., Khanikaev, A., . . . & Altug, H. (2011). Seeing protein monolayers with naked eye through plasmonic Fano resonances. Proceedings of the National Academy of Sciences, 108(29), 11784-11789.

Ye, J., & Thompson, C. V. (2011). Templated Solid-State Dewetting to Controllably Produce Complex Patterns. Advanced Materials, 23(13), 1567-1571.

Yesilkoy, F., Terborg, R. A., Pello, J., Belushkin, A. A., Jahani, Y., Pruneri, V., & Altug, H. (2018). Phase-sensitive plasmonic biosensor using a portable and large field-of-view interferometric microarray imager. Light: Science & Applications, 7(2), 17152-17152.

Yildirim, A., Yunusa, M., Ozturk, F. E., Kanik, M., & Bayindir, M. (2014). Microfluidics: Surface Textured Polymer Fibers for Microfluidics (Adv. Funct. Mater. 29/2014). Advanced Functional Materials, 24(29), 4568-4568.

Yu, N., & Capasso, F. (2014). Flat optics with designer metasurfaces. Nature materials, 13(2), 139-150.

Yu, N., Genevet, P., Kats, M. A., Aieta, F., Tetienne, J. P., Capasso, F., & Gaburro, Z. (2011). Light propagation with phase discontinuities: generalized laws of reflection and refraction, science, 334(6054), 333-337.

Zha, Y., & Arnold, C. B. (2013). Solution-processing of thick chalcogenide-chalcogenide and metal-chalcogenide structures by spin-coating and multilayer lamination. Optical Materials Express, 3(2), 309-317.

Zhang, L., Ding, J., Zheng, H., An, S., Lin, H., Zheng, B., . . . & Fang, Z. (2018). Ultra-thin high-efficiency mid-infrared transmissive Huygens meta-optics. Nature communications, 9(1), 1-9.

Zheludev, N. I., & Kivshar, Y. S. (2012). From metamaterials to metadevices. Nature materials, 11(11), 917-924.

Zou, Y., Moreel, L., Lin, H., Zhou, J., Li, L., Danto, S., . . . & Birkmire, R. (2014). Solution Processing and Resist-Free Nanoimprint Fabrication of Thin Film Chalcogenide Glass Devices: Inorganic-Organic Hybrid Photonic Integration. Advanced Optical Materials, 2(8), 759-764.

Zywietz, U., Evlyukhin, A. B., Reinhardt, C., & Chichkov, B. N. (2014). Laser printing of silicon nanoparticles with resonant optical electric and magnetic responses. Nature communications, 5(1), 1-7.

\* cited by examiner

Soft imprinting
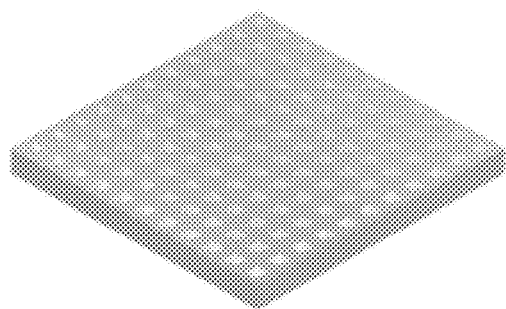 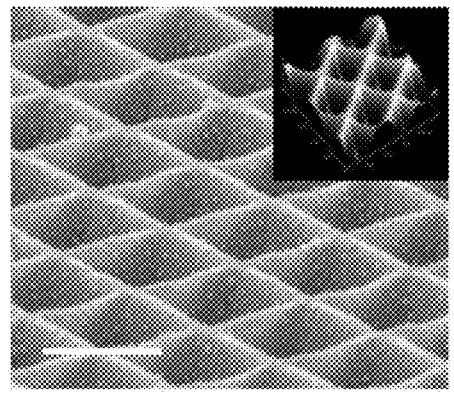
Thin film deposition
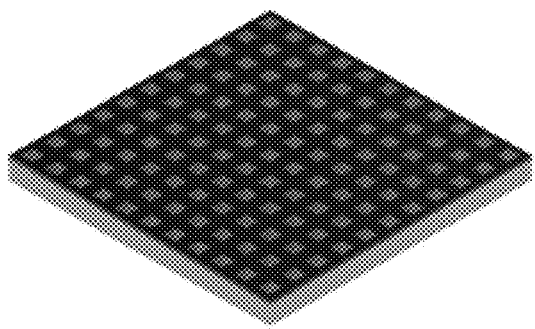 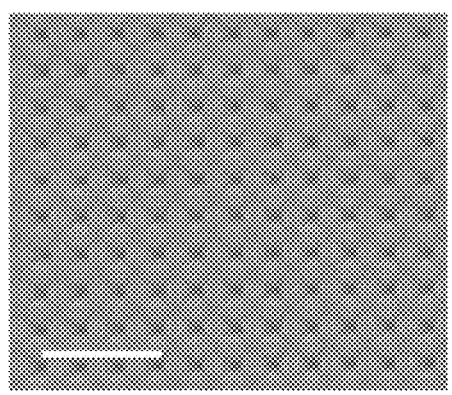
Dewetting
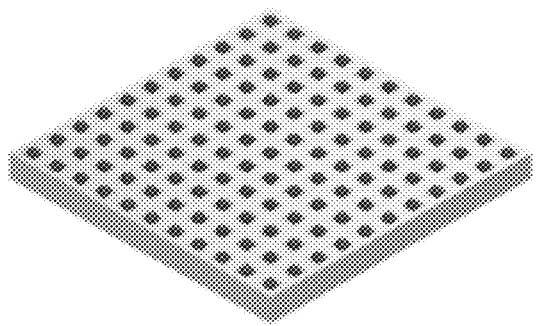 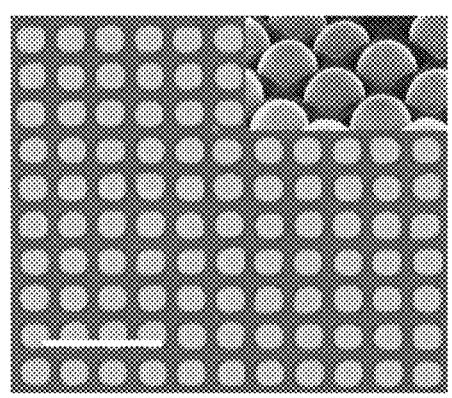
FIG. 1A

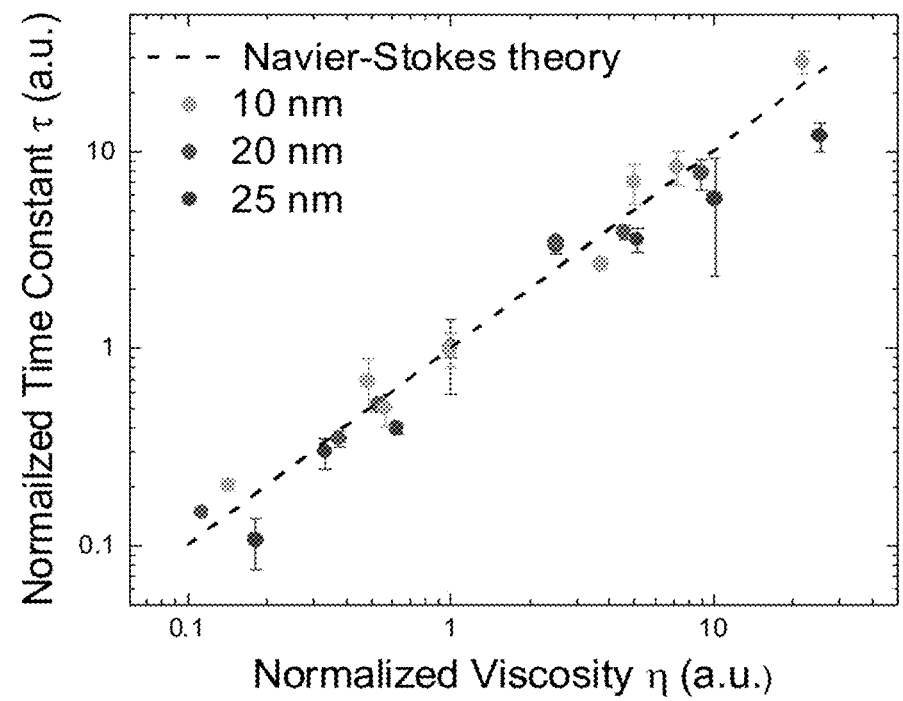
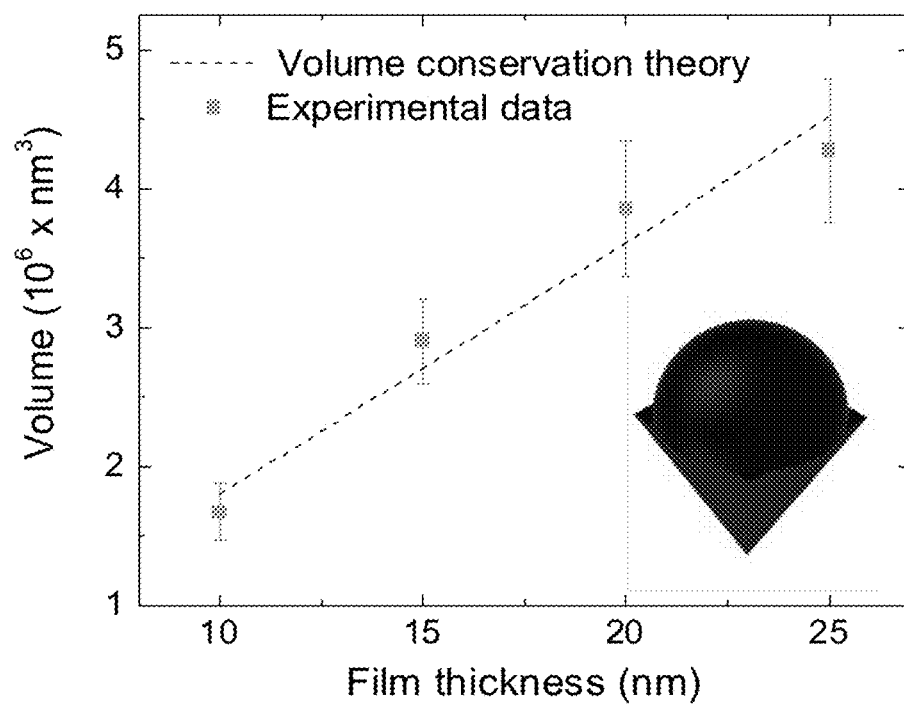
FIG. 2C

Tunable Sizes

Tunable Lattices

Tunable Materials

Different Substrates

METHOD AND SYSTEM FOR FABRICATING GLASS-BASED NANOSTRUCTURES ON LARGE-AREA PLANAR SUBSTRATES, FIBERS, AND TEXTILES

CROSS-REFERENCE TO RELATED APPLICATIONS

The present utility patent application claims priority to United States provisional patent application with the Ser. No. 62/802,725 that was filed on Feb. 8, 2019, the contents thereof herewith incorporated by reference in its entirety.

FIELD OF THE INVENTION

The present invention relates to the field of manufacturing of micro- and nanostructures on soft or hard substrates, and systems for performing such manufacturing, and glass-based micro- and nanostructures.

BACKGROUND

Modern devices with nanostructures require the tuning of the size, shape, and spatial arrangement of nano-objects and their assemblies with nanometer scale precision, over large-area and sometimes soft substrates. Such stringent multi-scale and mechanical requirements are beyond the reach of conventional lithography techniques or simpler self-assembly approaches. Therefore, new methods and systems for fabricating nanostructures, more specifically glass-based nanostructures are strongly desired, to overcome the disadvantages and limitations of the state of the art.

SUMMARY

According to an aspect of the present invention, a method for manufacturing glass-based micro- and nanostructure is provided. The method preferably includes the step of dewetting a thin-film glass layer on a textured substrate to form the micro- and nanostructure from the think-film glass layer.

According to another aspect of the present invention, a method for manufacturing a structure on a substrate is provided. Preferably, the method includes the steps of providing a textured substrate, depositing a thin layer of chalcogenide glass onto the textured substrate, and annealing the thin layer to induce a dewetting of the textured substrate to break up the thin layer to an array of dispersed and self-ordered nano-objects.

According to still another aspect of the present invention, a system for manufacturing a structure on a substrate is provided. Preferably, the system includes device to provide for a textured surface into a substrate to form a textured substrate, a thin-film deposition device configured to deposit a thin layer of chalcogenide glass onto the textured substrate, and an annealing chamber configured to anneal the thin layer to induce a dewetting of the textured substrate to break up the thin layer to an array of dispersed and self-ordered nano-objects.

According to yet another aspect of the present invention, with some features of the method and system, it is possible to obtain an unprecedented control over the fluid instabilities of thin glass films or layers as a simple approach for the self-assembly of micro- and nanostructures, for example advanced all-dielectric optical metasurfaces. It has been shown that the tailoring of the position, shape and size of nano objects with feature sizes below 100 nm and with inter-particle distances down to 10 nm is possible. According to another aspect of this invention, the method and system proposes a simple and versatile approach that can generate optical nanostructures over tens of centimeters sized rigid and soft substrates, with better optical performance and a resolution on par with advanced traditional lithography-based processes. To underline the potential of the herein presented method and system, with experiments and via numerical simulation, it has been shown that sharp Fano resonances with the highest Quality factor (Q.F~300) in the visible to date can be achieved. Such resonances are exploited to realize high efficiency protein monolayer detection highlighting the unprecedented reconciliation between state-of-the-art optical performance and simple self-assembly fabrication approaches.

Moreover, according to another aspect of the present invention, the method and system can be applied to all materials that can be deposited as thin films that can dewet on the chosen substrate, and that can be processed in a highly viscous state. In preferred embodiments, these materials can be inorganic materials. For example, the present method and system can be applied to textured substrates, and Van der Waals interactions can be tuned through surface treatment to induce desired thin film instability. The nature of the substrate can be fully rigid, flexible and stretchable substrates. For both flexible and stretchable substrates, the method and system does not involve any transfer techniques, which are so far used and limiting for such type of fabrication processes. According to some other aspects, the method and system can be based on soft nanoimprint technology, and can thus be scaled up to large area, using established techniques such as roll-to-roll technique. Generation of micro- and nanostructures of a surface area of at least 10 cm to 20 cm has been demonstrated. The separation between structures can reach any value down to at least 10 nm or even down to 5 nm.

According to some aspects of the present invention, a method and system is presented to make glass-based micro and nanostructure from the dewetting of a thin-film on a chemically or physically textured substrate. According to yet some other aspects, a method is presented for making isolated particle of prescribed position and size, or continuous line, rings or any percolated structures from a template dewetting process of thin glass layers.

In some embodiments, the tuning of the particle size may be made by changing the initial film thickness, or the substrate pattern parameters. In some embodiments, the tuning of the particle size may be made by the successive dewetting of thinner layers, see for example FIG. 1A. In some embodiments, the tuning the interparticle gap may be down to 10 nm and below through successive dewetting of thin layers. In some embodiments, the switching from 2D to bilayer structures may be made by simply tuning substrate lattice and thickness of the film, see for example FIGS. 3A to 3I. In some embodiments, the method and system is directed to the fabrication of percolated structures, for example but not limited to 2D structures for interconnects and photonic circuits for example but not limited to waveguides, ring resonators, polarizers, by controlling interplay between Rayleigh instability and spinodal dewetting, see for example FIGS. 4A to 4D. In embodiments, the tuning of the particle depth may be made by tuning the viscosity of the transfer resin. This transfer can in particular be applied to tips of optical fibers for optical fiber refractometry sensing, for example to a lab-on-a-chip device. In some embodiments, the tuning of the lattice constant may be based on the applied pressure that makes the initial texture.

The above and other objects, features and advantages of the present invention and the manner of realizing them will become more apparent, and the invention itself will best be understood from a study of the following description with reference to the attached drawings showing some preferred embodiments of the invention.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

FIGS. 1A to 1C illustrate stages and results of the fabrication process or method for optical metasurfaces, with FIG. 1A showing schematic (left) and SEM image (right) of the process with an optical glass ($Ge_6Se_{82}Te_{12}$). The fabrication starts with (i) thermal or UV-nanoimprinting of the required pattern on a substrate. The AFM profile of the texture is shown in inset of the right SEM image. The scale bar is 400 nm. (ii) Thin film deposition of high-index optical glass. The scale bar is 1 µm. (iii) Annealing to induce the dewetting process. The scale bar is 1 µm. The inset shows a tilted view for a 350 nm square lattice with selenium nanoparticles. FIG. 1B shows on the left side particle size distribution obtained upon single-step dewetting showing the tunability of particle size. The inset shows the corresponding SEM images for different film thicknesses. All scale bars are 350 nm. On the right, cross-sectional TEM analysis is depicted showing bright field image of the Se nanoarray, along with the associated diffraction pattern. The bright field image scale bar is 200 nm. The dark field image scale bar is 5 $nm^{-1}$. FIG. 1C shows an optical photograph showing a large area (20 cm×11 cm) EPFL logo-shaped metasurface on a polymer substrate. Inset shows the SEM image of the corresponding nanostructure. The scale bar is 1 µm;

FIGS. 2A to 2F show different stages of the system and method, and results thereof, with FIG. 2A showing a schematic of the dewetting process illustrating the fluid mechanics at play. From top to bottom: thin film deposition, film smoothening driven by Laplace pressure, pinch-off favored by disjoining pressure, evolution of system towards equilibrium contact angle. FIG. 2B shows a top view SEM image showing the dewetting phenomenon that matches well our proposed scenario. All scale bars are 350 nm. FIG. 2C shows on the top an evolution of dewetting time constants extracted from color evolution during the process versus film viscosity. Experimental data follows the theoretical scaling law predicted by the Navier-Stokes formalism. On the bottom, an average volume of a single particle obtained after dewetting versus the film thickness is shown. Experimental values match well with theoretical volumes calculated assuming no re-evaporation or material loss. Inset image shows the particle geometry used for the theoretical volume calculation. FIG. 2D shows SEM image illustrating the predominance of spinodal dewetting when annealing a 10 nm Se—Te (Selenium-Tellurium) layer on a polycarbonate substrate with a 350 nm square lattice. The scale bar is 500 nm. FIG. 2E shows SEM images showing the three main types of defects: (from top to bottom) interstitial defects (scale bar 2 µm), vacancies (scale bar 5 µm), and particle size distribution (scale bar 1 µm). For interstitials and vacancies, we define the probability to find a defect per unit cell, denoted respectively $P_{inter}$ and $P_{vacancy}$. For size distribution, we define the relative standard deviation $\sigma_{relative}$ as the ratio of the absolute particle size standard deviation over the lattice period. All particle arrays are 350 nm square lattice with Se nanoparticles. FIG. 2F shows large-scale SEM image showing nearly perfect arrays of selenium (Se) nanoparticles obtained on a 350 nm square periodic lattice simply by reducing the mesa size with regards to FIG. 2E. All three parameters characterizing defects are largely improved. The scale bar of the large area picture is 5 µm, and the one for the inset is 2 µm;

FIG. 3A to 3I shows aspects of the scalability of the fabrication method, with FIG. 3A showing dewetting of optical glass on 1000 nm square lattice (scale bar 1 µm), 200 nm square lattice (scale bar 1 µm), and in FIG. 3B showing 350 nm triangular lattice (scale bar 1 µm). The method applies to different material composition such as the optical glass Ge6Se82Te12 (scale bar 350 nm) as shown in FIG. 3C and selenium (scale bar 350 nm) for FIG. 3D. The process applies to different substrates, with FIGS. 3A to 3C using thermoplastic polycarbonate and FIG. 3D elastomeric PDMS. Structures obtained by engineering the pattern parameters and deposition cycles. FIG. 3E to 3G show that by widening the inter-pit distance ("mesa"), quasi-3D structures can be obtained. For example, FIG. 3E shows cross-sectional schematics showing the dewetting process for large mesas. FIG. 3F on the left shows SEM image showing the top view of the quasi-3D structures experimentally observed. The scale bar is 2 µm. On the bottom right of FIG. 3F, 30° tilted SEM image of the quasi-3D structure along with (top right) the corresponding 3D-schematic. The scale bar is 500 nm. FIG. 3G shows size distribution of particles on mesas (top) and within pits (bottom). FIGS. 3H to 3I shows that by engineering the deposition cycles, small inter-particle distance can be obtained. FIG. 3H show schematics illustrating the successive deposition process, and FIG. 3I shows on top SEM images and at the bottom corresponding particle size distribution of successive optical glass deposition (here selenium) and dewetting. All scale bars are 350 nm;

FIG. 4B shows a top view SEM image illustrating the process: (top) initial thin continuous film on a 350 nm periodic 1D texture. The scale bar is 1 µm (middle) Reflow induces thinning of the film above the concave regions of the pattern, favoring the growth of spinodal instabilities parallel to the lines. This ultimately leads to hole formation and coalescence along line direction on the concave regions of the texture (as shown in inset). The scale bar is 2 µm. (bottom) System frozen in metastable state after dewetting but before the growth of significant Rayleigh-Plateau instabilities along the cylinder's free surface. The scale bar is 1.5 µm. Inset shows the cross-section of one line. The scale bar is 200 nm. FIG. 4C shows different complex structures obtained: cross arrays (top left) triangular metasurface (top right), honeycomb structures (bottom left) and "EPFL" logo (bottom right). The scale bar is 2 µm.

FIG. 6B shows active tuning of resonance in near infra-red region on applying a mechanical strain from 0 to 50%. The 2D plot shows the single transmission dip split into two transmission dips at around 15% tensile strain. The increase (resp. decrease) in interparticle distance along (resp. perpendicular) the stretching direction leads to a red shift (resp. blue shift) in the transmission dip. Right graphs show the experimental transmission spectra with (top) 50% and (bottom) 0% applied strain. The inset shows the top view of the simulated structure. The scale bar is 500 nm. FIG. 6C on the top shows experimental and on the bottom simulated transmission spectra for quasi-3D structure showing a dip around 1050 nm. FIG. 6D shows simulated phase and corresponding electric and magnetic field plots showing a $2\pi$ phase change within 75 nm of wavelength. The phase shift is attributed to the coincidence between electric and magnetic field lattice resonance (Second Kerkers condition). This is supported by the electric and magnetic (left) field plots and (right) field maps at 1050 nm;

FIG. 7B shows a plot demonstrating the effect of the applied pressure on the transmission spectra of a Se metasurface based on a substrate with pressure-tuned lattice;

FIG. 9B shows on the left simulated transmission with the top curve, magnetic field with the middle curve, and electric field profile with the lower curve of a Se nanoarray of periodicity 350 nm with a 30 nm interparticle gap. The simulated transmission spectra also show a Fano profile due to the interference of sharp discrete electric (gap) field resonance and broad (continuous) magnetic resonance. (right) Cross-sectional magnetic (top) and electric (bottom) field profiles at their respective resonance. Field distributions are normalized to their own maximum. FIG. 9C shows A/G protein monolayer sensing: (left) Experimental and simulated transmission spectra before (solid line) and after (dashed line) addition of a 10 nm protein monolayer. Both the experimental and simulated curves show a shift of approximately 10 nm (indicated in the curve by $\Delta\lambda$). FIG. 9D shows sensitivity curve representing the spectral shift in the resonance as a function of the protein concentration ($S=\Delta\lambda/\Delta n$). Inset shows the dynamic range corresponding to the linear region of the concentration curve;

DETAILED DESCRIPTION OF THE SEVERAL EMBODIMENTS

Figure 1B:
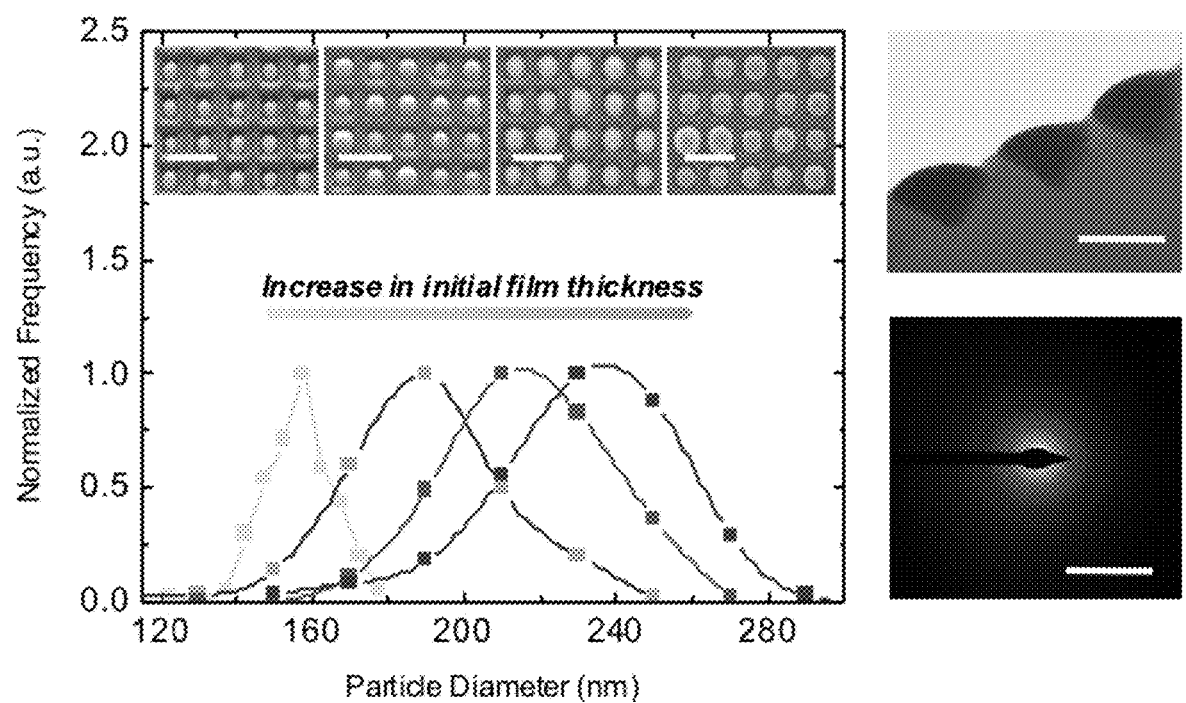

Within the general context of some aspects of this invention, it has been shown that plasmonic and dielectric nanostructures offer novel opportunities to modulate electromagnetic waves over sub-micrometer length scales, opening exciting avenues for ultra-thin optics, flexible photonic circuits and imaging. These optical metasurfaces also enable to tailor the localization of electromagnetic fields as well as optically induced magnetic and electric dipole resonances to generate highly efficient systems for lighting and energy harvesting, sensing, surface-enhanced Raman spectroscopy, non-linear optics and filters. To realize such optical nanostructures, significant fabrication challenges in nanotechnology need to be addressed. High-quality optical structures require a precision at the nanometer scale over the size, shape, position, orientation and roughness of nano-objects. For technological impact, the fabrication strategies must be scalable and compatible with large area substrates. It is also required for most emerging applications to realize precise nanostructures over flexible and stretchable substrates.

Top-down fabrications approaches rely on lithographic techniques that allow for high resolution and repeatability, but remain complex with multiple processes that are difficult to scale to large-area and non-rigid substrates. This is particularly true for sub-100 nm scale architectures where E-beam lithography remains cumbersome, time and resources intensive, which has hindered so far their deployment in practical applications. It is also not well suited for the fabrication of 3D structures, and the process tends to generate surface defects and roughness, which inevitably results in scattering losses. Several alternative approaches have been proposed for both plasmonic and dielectric nanophotonic structures, mostly based on bottom-up strategies. These include laser printing, chemical or self-assembly methods, topographical control of particle positioning or more recently DNA-assisted templates to fabricate hierarchical structures. While they allow for simpler and more scalable processing, such methods still require several complex steps to organize nano-objects in the proper configuration, and have not demonstrated optical structures with state-of-the-art properties. It remains also challenging to generate structures with complex shapes, continuous or percolated features such as waveguides and resonators for integrated photonic circuits. All these approaches are additionally not well adapted to soft substrates, which has prevented dynamic tuning of dielectric metasurfaces and restricted their fields of applications.

Exploiting fluid instabilities to realize self-assembled nanostructures is emerging as a novel approach to make electrical interconnects or optical structures. The dewetting of thin metallic and polymeric films has been investigated at different scales and on different substrates. See for example, Jongpil, Y. and Thompson, C. V., "Templated Solid-State Dewetting to Controllably Produce Complex Patterns," Advanced Materials, Vol. 23, pp. 1567-71, 2011, Le Bris, A., Maloum, F., Teisseire, J., and Sorin, F., "Self-organized ordered silver nanoparticle arrays obtained by solid state dewetting," Applied Physics Letters, Vol. 105, p. 203102, 2014, Sharma, A., and Khanna, R., "Pattern Formation in Unstable Thin Liquid Films," Phys. Rev. Lett., Vol. 81, p. 3463 (1998), Xie, R., Karim, A., Douglas, J. F., Han, C. C., and Weiss, R. A. "Spinodal Dewetting of Thin Polymer Films," Physical Review Letters, Vol. 81, pp. 1251-1254, 1998, these four publications herewith incorporated by reference in their entirety. While the template dewetting of metals has a great potential for electrical interconnects, the shape and roughness for smaller structures are hard to control and the polycrystalline microstructure affect their optical properties. Polymers can dewet into complex nano-scale and smooth architectures but their optical properties do not allow for advanced optical designs. Outside from the field of optical and multi-material fibers, fluid instabilities of viscous optical glasses have never been investigated to realize photonic structures on 2D substrates. Owing to their low radiative and non-radiative losses as well as to their high refractive indices, optical glasses in the proper architectures can exhibit optical properties on par or better than their metallic counterparts. Fluid-based processes such as liquid depositions, thermal imprinting or molding techniques have shown interesting approaches to realize 2D photonic architectures based on optical glasses such as Chalcogenides. While interesting systems could be realized, limitations remain regarding crystallization and stress-induced effects, as well as the type of achievable architectures, that a well-understood and controlled process based on the subtle effects of fluid instabilities could alleviate.

According to some aspects of the present invention, it has been demonstrated for the first time the control over fluid instabilities of optical glass thin films to realize state-of-the-art nanophotonic structures over large area, soft and rigid substrates. Generally speaking, a "film" or "thin film" as used herein relates to the thin form factor of a layer of a material having a thickness that is smaller than 10 µm. Typically, a film is a solid or liquid layer of a material having an upper surface and a bottom surface, with any suitable shape, and a thickness generally in the order of micrometers or nanometers, depending on the needs and circumstances. In some embodiments, the thin-film thickness is preferably comprised in a range between 10 nm and 10 µm, more preferably in a range between 30 nm and 1 µm, such as for instance 50 nm, 100 nm or 200 nm.

Capitalizing on the interplay between texture reflow, spinodal instabilities and capillary break-up, we model and experimentally demonstrate the self-assembly of a variety of optical nanostructures with feature sizes down to ~100 nm and inter-particle distance down to 10 nm. The architectures we show include two-dimensional arrays of nanoparticles with controlled shapes, straight and circular lines, as well as quasi three-dimensional constructs. This process has been demonstrated on a variety of Chalcogenide glass compositions that exhibit the proper thermo-mechanical and fluidic attributes, and can be used as optical waveguides, for their non-linear optical properties, their phase change and optoelectronic properties, as well as in sensing and metasurfaces. To demonstrate the quality of the nano-structures we can achieve, we demonstrate a variety of advanced optical effects including phase modulation and mechanically tuned optical resonance.

It also has been demonstrated that sharp Fano resonance with unprecedented Quality Factor (Q.F) of 300 in the visible can be achieved, better than structures fabricated via traditional lithography, allowing for efficient bio-sensing applications. This new nanotechnology platform reconciles state-of-the-art optical properties with simple and scalable self-assembly processes for applications in sensing, energy harvesting, photonic circuits, metasurfaces and stretchable optics.

According to an aspect of the present invention, a method and system for manufacturing glass-based nanostructures on a large-area soft or hard planar surfaces, fibers, and textiles is proposed, as shown exemplarily in FIG. 1A. With this method, first soft lithography step is used to produce a variety of textured substrates. The soft lithography step begins with the fabrication of a silicon mask with the desired pattern, further molded onto a Polydimethylsiloxane (PDMS) substrate. This PDMS mask with the negative texture of the original Si mask is then imprinted onto a thermoplastic or sol-gel layer via thermal or ultraviolet (UV) nano-imprinting, see in FIG. 1A (i). A thin layer of chalcogenide glass is then deposited by thermal evaporation or other approaches, see for example FIG. 1A (ii), before a step of annealing is performed in ambient air at different temperatures and for different times, as illustrated in FIG. 1A (iii). The annealing induces a dewetting of the glass layer that breaks up into an array of well-dispersed and self-ordered nano-objects, as apparent on the Scanning Electron Microscope (SEM) images of FIG. 1A, showing an array of $Ge_6Se_{82}Te_{12}$ nanoparticles obtained upon annealing of a 40 nm thick film at 100° C. for 5 minutes. This self-assembly occurs for different initial film thicknesses as shown in FIG. 1B, where the particle size distribution is plotted for four different initial thicknesses of pure Se films. It appears that the underlying pattern imposes the periodicity and position of the particles, while the amount of material deposited dictates the particle size. The nano-objects adopt the shape and occupy the convex regions of the underlying texture, as shown in the top Transmission Electron Microscope (TEM) image of FIG. 1B. The diffraction pattern from the TEM sample shows that the glass remains amorphous during the whole process.

Figure 1C:
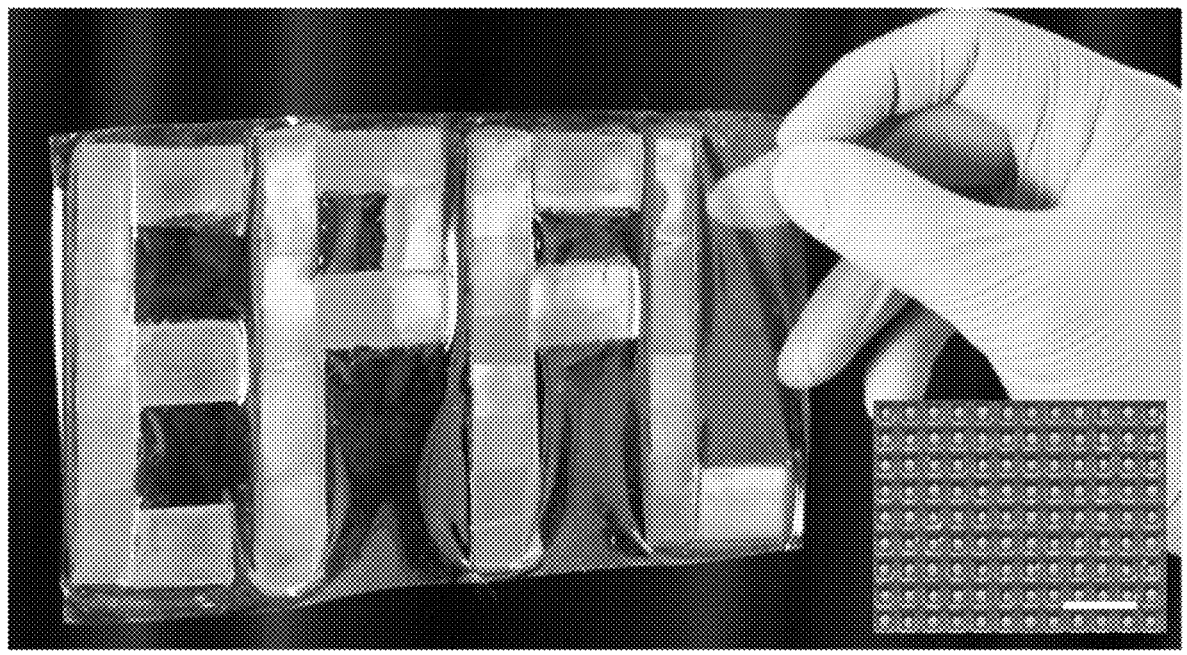

The method as described above is simple and uses a low temperature approach that can be applied over a large-scale as we highlight in FIG. 1C where an "EPFL" logo via the embossing of a 20 $cm^2\times11$ $cm^2$ polycarbonate sheet with nanostructured assembled PDMS molds (see methods below) has been manufactured. The inset of FIG. 1C shows a SEM view of the patterned area with a nearly perfect array of high dielectric constant nano-objects. Beyond this analysis, advanced techniques for large-scale soft embossing exist in industry with resolutions down to a few hundreds of nanometer, which could be used in combination with the herein presented system and method that relies on dewetting to realize glass nanostructures beyond wafer scales.

Figure 2A:
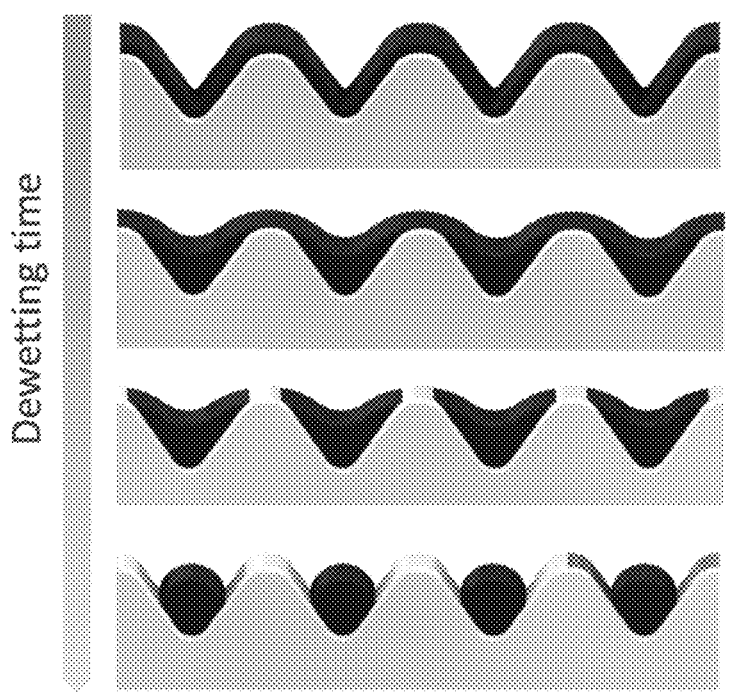
Figure 2B:
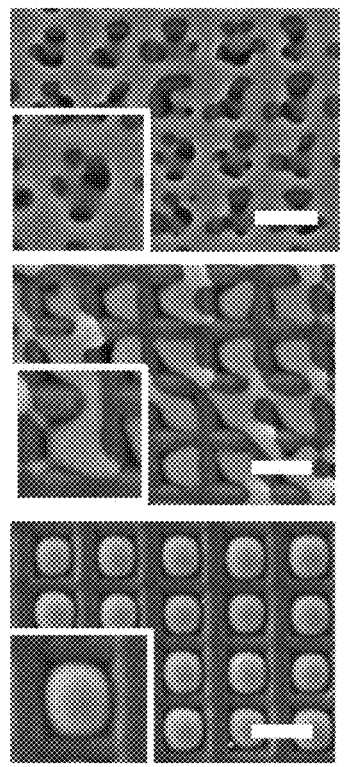
Figure 2D:
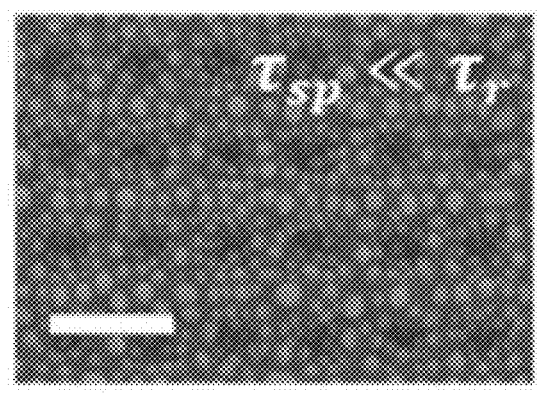
Figure 2E:
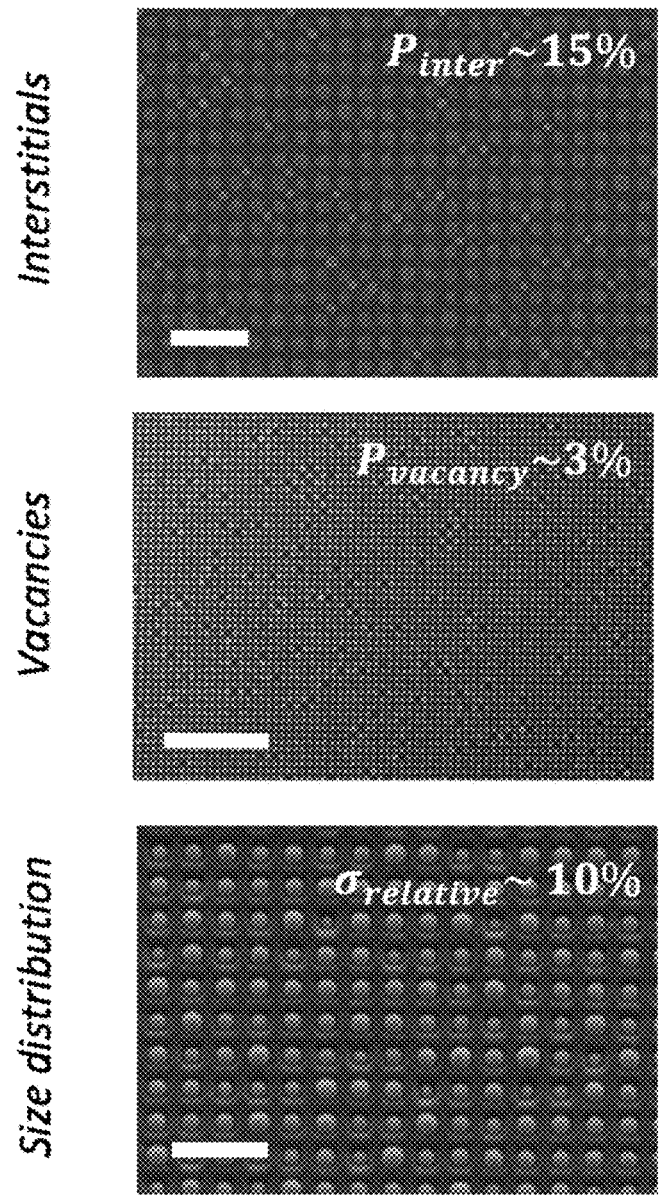
Figure 2F:
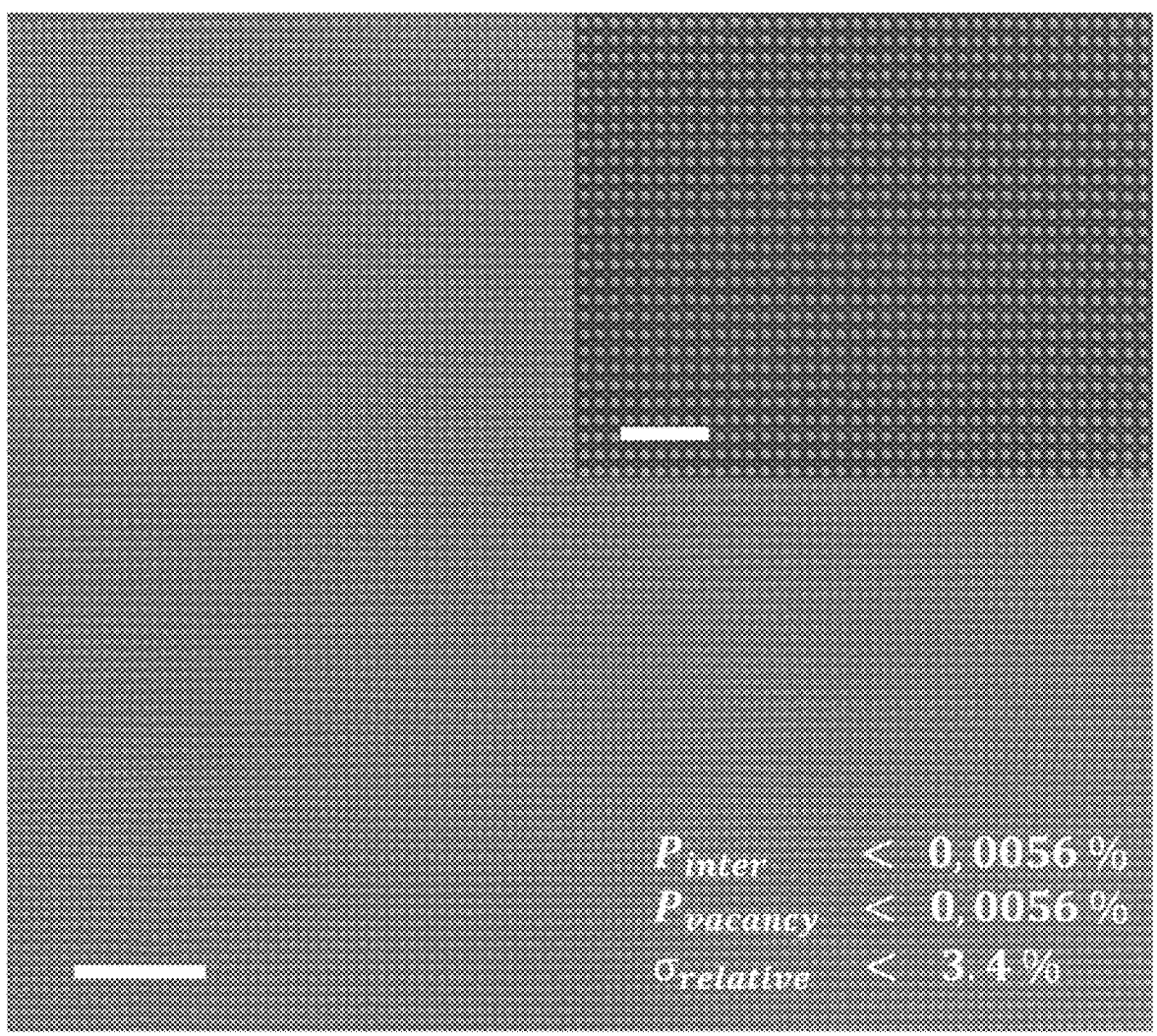

With respect to the proposed method, FIGS. 2A to 2E show different aspects of the steps of the method. For example, FIG. 2A exemplarily shows a schematic of the dewetting process illustrating the fluid mechanics at play. From top to bottom: thin film deposition, film smoothening driven by Laplace pressure, pinch-off favored by disjoining pressure, evolution of system towards equilibrium contact angle. FIG. 2B shows a top view SEM image showing the dewetting phenomenon that matches well our proposed scenario. All scale bars are 350 nm. FIG. 2C shows on top the evolution of dewetting time constants extracted from color evolution during the process versus film viscosity. Experimental data follows the theoretical scaling law predicted by the Navier-Stokes formalism. (bottom) Average volume of a single particle obtained after dewetting versus the film thickness. Experimental values match well with theoretical volumes calculated assuming no re-evaporation or material loss. Inset image shows the particle geometry used for the theoretical volume calculation. FIG. 2D shows SEM image illustrating the predominance of spinodal dewetting when annealing a 10 nm SeTe layer on a polycarbonate substrate with a 350 nm square lattice. The scale bar is 500 nm. FIG. 2E shows SEM images showing the three main types of defects: (from top to bottom) interstitial defects (scale bar 2 μm), vacancies (scale bar 5 μm), and particle size distribution (scale bar 1 μm). For interstitials and vacancies, we define the probability to find a defect per unit cell, denoted respectively $P_{inter}$ and $P_{vacancy}$. For size distribution, we define the relative standard deviation $\sigma_{relative}$ as the ratio of the absolute particle size standard deviation over the lattice period. All particle arrays are 350 nm square lattice with Se nanoparticles. FIG. 2F shows large-scale SEM image showing nearly perfect arrays of selenium nanoparticles obtained on a 350 nm square periodic lattice simply by reducing the mesa size with regards to the showings of FIG. 2E. All three parameters characterizing defects are largely improved. The scale bar of the large area picture is 5 μm, and the one for the inset is 2 μm.

To better understand and exploit this fabrication approach, it is shown how the physics behind the template dewetting at play here can be well understood by a fluid mechanics formalism. Unlike polycrystalline metallic thin-films, the deposited glass layer is in an amorphous state, with an isotropic microstructure, and remains so after dewetting as shown in FIG. 1B. The material can hence flow in a relatively high viscosity state when heated above its glass transition temperature ($T_g$), similarly to polymers. The following scenario is used to explain the dewetting, schematically represented in FIG. 2A. As we heat a film deposited on a textured substrate close to its $T_g$, reflow driven by the Laplace pressure at the glassy layer—air interface tends to flatten the film surface to reduce its surface area. At the other interface between the glass and the substrate, the spreading parameter of high surface energy covalently-bonded glasses onto polymeric substrate is negative. The resulting disjoining pressure increases as the film gets thinner above the concave tip domains of the texture (typically a few nanometers), which accelerates thinning and breaking-up of the film. Surface tension then drives the material into its equilibrium shape, defined by the equilibrium angle between the substrate and the glassy material. In FIG. 2B, we show a series of SEM images of the dewetting of a thin chalcogenide glass layer on a textured polymer substrate, which capture well this scenario.

To support analytically this sequence, a Navier-Stokes formalism is used to describe the film thickness dynamics, which takes into account the role of curvature-induced Laplace pressure and viscous forces. For the sake of simplicity, the analysis is limited to a one dimensional problem, with a substrate having a sinusoidal shape $s(x)=S_0 \cdot \sin(K \cdot x)$, where K is the wavenumber associated to the pattern periodicity. The Chalcogenide glass is treated as an incompressible Newtonian fluid. Using the lubrication approximation, the following equation defining the evolution of film thickness over time is obtained to extract the evolution equation of the film thickness h(x,t) over time:

$$\frac{\partial h}{\partial t} + \frac{1}{3\eta} \frac{\partial}{\partial x}\left[h^3 \cdot \frac{\partial}{\partial x}\left(\gamma \frac{\partial^2 (h+s)}{\partial x^2} + \phi(h)\right)\right] = 0 \quad \text{(i)}$$

with γ the surface free energy of the glassy layer, η its viscosity and φ(h) the disjoining pressure arising from molecular interactions. To estimate the initial dynamics time scale, we proceed to neglect the role of disjoining pressure. During the first stage of the process, the problem is hence reduced to a capillary leveling problem. A time constant $\tau_r$, which characterizes reflow induced by the template, can be extracted from Equation (i):

$$\tau_r = \frac{3}{\gamma h_0^3 K^4} \cdot \eta \quad \text{(ii)}$$

As reflow occurs, the film becomes thin over the concave regions of the substrate. In this particular region, molecular interactions become non-negligible and disjoining pressure favors the development of localized instabilities, probably prominently of spinodal nature. By using a similar fluid mechanics approach, a time constant $\tau_{sp}$ can be associated to film break-up driven by spinodal instabilities:

$$\tau_{sp} = \frac{3}{\gamma h_0^3 k_m^4} \cdot \eta \quad \text{(iii)}$$

Where $k_m$ is the dominant instability wavenumber. This time scale is associated with the Van der Waals interactions between the substrate, the film and the superstrate through the Hamaker constant. It depends on the nature of the substrate and the initial layer thickness, and is a key parameter in template dewetting. Indeed, time scales associated to reflow ($\tau_r$) and to spinodal instabilities ($\tau_{sp}$) can be compared to distinguish the dominating phenomenon during the different stages of the process. For successful template dewetting, it is essential that reflow takes place on a much shorter time scale than spinodal instabilities $$\left(\frac{\tau_r}{\tau_{sp}} \ll 1\right)$$

over the whole pattern during the initial stage of the process. This indeed allows for the film to get thinner on localized areas of the pattern, where spinodal instabilities will evolve on an increasingly shorter time scale than reflow $$\left(\frac{\tau_r}{\tau_{sp}} \gg 1\right),$$

eventually leading to film break-up at these prescribed locations and ultimately yielding an ordered particle array.

To further support our model experimentally, we studied the dewetting dynamics via colorimetry. The top graph of FIG. 2C plots the experimental normalized time constants measured for films of various thicknesses versus the viscosity of the film at the temperature of the dewetting. These time constants are compared with the theoretical ones expected from Equation (i). The good agreement between theoretical prediction and experimental data demonstrates that the time constants are indeed proportional to viscosity and dewetting dynamics can be well described by the Navier-Stokes formalism. Additionally, good agreement between initial deposited volumes and experimental particle volumes determined by image analysis demonstrates the absence of material re-evaporation, see in FIG. 2C in the bottom, which further supports the chosen fluid mechanics model, as further discussed below.

Before investigating the different architectures enabled by this approach, aspects of the template dewetting of thin glass layers is analyzed. By looking at different scenarios when we change the thickness of a SeTe layer, keeping the substrate and its texture unchanged, we can vary $\tau_{sp}$ compared to $\tau_r$ in a controlled way, which reveals the dominating instabilities at different times and positions on the substrate. In particular, a first extreme example is shown in FIG. 2D, where the initial film thickness is very small, which results in a reduced spinodal time scale and an associated instability that dominates over reflow ($\tau_{sp} \ll \tau_r$). The film does not have the time to feel the effect of the texture, and dewets randomly like on a flat substrate. To obtain a self-organized structure, one approach is to deposit a thicker film to slow down spinodal dewetting and allow for reflow to occur. A thicker film however means larger nano-objects after dewetting, which sets an ultimate feature size for a given glass composition, substrate and texture. Note that the model assumes a continuous initial thin layer, an assumption that can break down when being below a percolation threshold for films of thickness 10-15 nm and below. Another approach to tune $\tau_{sp}$, without further reducing the thickness and ensure that we start with a uniform and percolated layer, is to change the nature of the substrate. Dewetting 20 nm Se film on two different substrates with the same texture results in different dynamics. On one substrate, the dynamics is dominated by reflow ($\tau_{sp} \gg \tau_r$) leading to an ordered array, and in the other case by spinodal instability ($\tau_{sp} \ll \tau_r$) leading to a random array.

When the reflow and spinodal time scales are initially comparable, the film can dewet following the underlying pattern but with some randomly distributed defects where spinodal instabilities could locally dominate. These defects can be classified in three main categories, as shown in FIG. 2E for a 40 nm Se layer dewetted on a textured PC substrate: interstitial particles that sit on the mesa, see the top figure, vacancies, which refer to the absence of nano-object within the volume of some inverted pyramids, see the middle figure, and third, the size distribution that characterize a large variance in nano-object targeted sizes, see the bottom figure, and which can be detrimental for the desired optical response. Note that these defects can also be a result of experimental conditions such as a poorly uniform pattern or film thickness homogeneity. They can be to a large extent avoided by a clean and careful process, but most importantly by going to a regime where reflow initially strongly dominates over spinodal instability ($\tau_{sp} \gg \tau_r$). To do so, keeping the same glass, in this case selenium (Se) and initial thickness, a silica substrate was etched with the same initial texture to increase local curvature and hence lower $\tau_r$ to accelerate reflow. The result is a nearly perfect self-organization of nano-objects over a large area with no defect and a narrow size distribution, as shown in FIG. 2F.

Figure 3A:
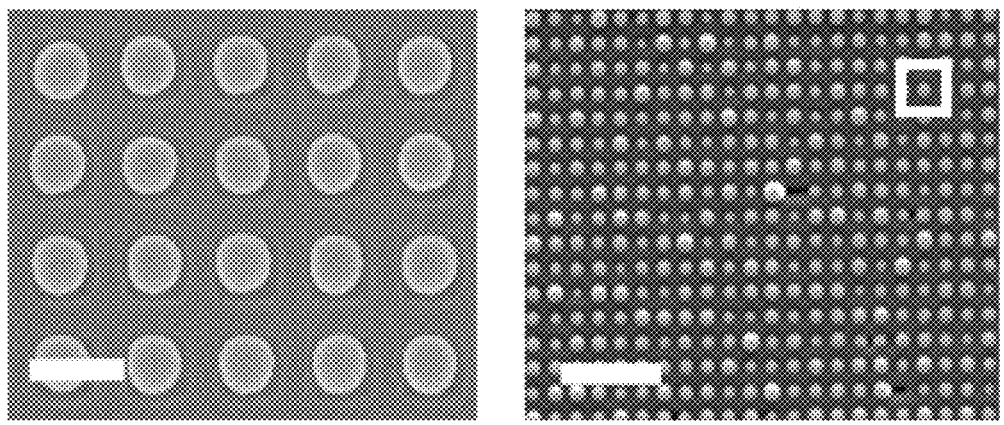
Figure 3B:
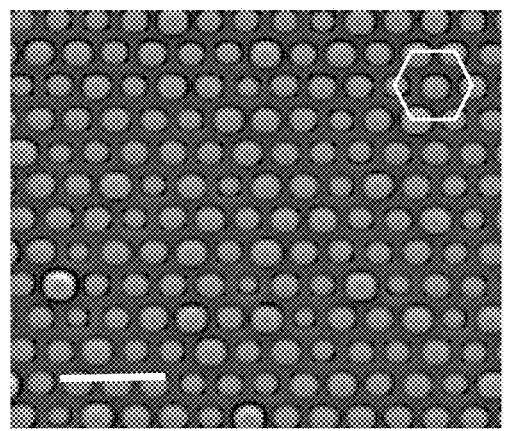
Figure 3C:
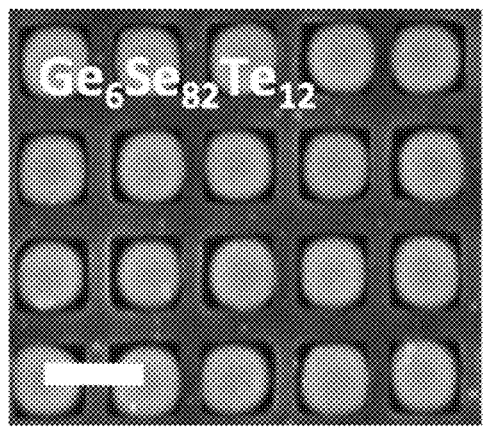
Figure 3D:
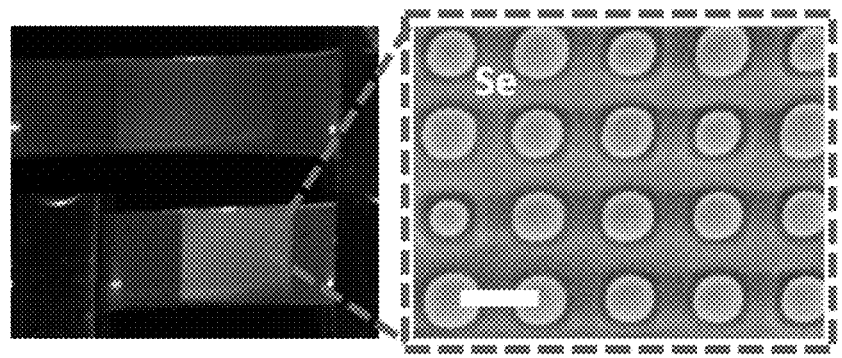

Different architectures from the template dewetting-based process can be achieved. The principles discussed above can be applied to a variety of glassy materials, substrates and textures to produce in a simple and scalable way micro- and nanoparticle arrays with different functionalities. In FIG. 3A to 3D, different examples of this versatility are shown. By changing the texture characteristics of the underlying pattern, a wide range of particle sizes and periodicities can be generated as illustrated in FIG. 3A. Structure sizes down to around 100 nm have been achieved, which could be further reduced with deeper pyramid inducing a higher curvature as discussed above to enhance reflow. Going significantly below this feature size however would require initial thicknesses below percolation threshold, and accordingly entails a different dynamic than the one captured by our model. Curvature-driven diffusion could lead to the self-organization of nano-objects and it is being investigated to organize smaller nano-objects. The lattice arrangement of particles can also be tailored from square to hexagonal, see for example FIG. 3B, which constitutes another way to tailor optical properties. The material composition can further be engineered to change the properties of the dewetted glass. From pure amorphous Selenium (Se) to Selenium Telluride (SeTe) we go from an index of refraction of 2 to 4 in the visible. Adding Germanium ($Ge_6Se_{82}Te_{12}$) might allow for a typical composition to be investigated for its phase-changing characteristics in optical memories, see for example FIGS. 3A and 3C. Low processing temperatures enable the use of less conventional flexible and stretchable substrates such as thermoplastic sheets or elastomers (Polydimethylsiloxane (PDMS) or Styrene-Ethylene-Butylene-Styrene (SEBS)) to realize stretchable nanophotonic systems as shown in FIG. 3D.

Note that, while we could identify textures and film thickness that lead to self-organized nano-objects on soft substrates, their low Young's modulus can influence the dewetting process due to the potential mechanical deformation that can occur as the material breaks up. The optical properties of hard and soft substrates can be further tailored by inducing porosity or adding fillers to polymers or sol-gels. Template dewetting directly on textured Silicon or other higher index materials is also possible, with interesting opportunities for advancing Silicon photonics.

Figure 3E:
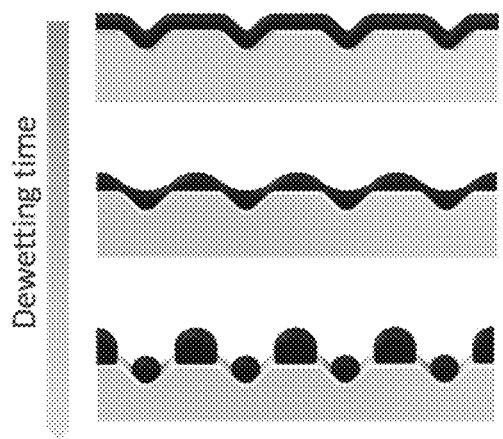

Based on the understanding of aspects of the method and system, more complex architectures that can be designed. Because the deposited film will break up above concave regions of the pattern, increasing the distance between the pyramid (the "mesa") will leave in this region material that has not reflown around their edges. As illustrated in the schematics of FIG. 3E, the remaining film will reflow into its equilibrium shape governed by the contact angle between the glass and the substrate. These engineered fluid instabilities produce particles both within pits and on top of mesas, yielding quasi-3D arrays of particles. The SEM image shown in FIG. 3F along with size distribution in FIG. 3G show interesting optical properties that are further discussed below.

With aspects of the present system and method, arrays of various particle sizes and periodicity can be generated, it remains challenging to control inter-particle distance. Some applications may require a large distance between isolated nano-objects, which is difficult to achieve with this approach because, as we show above with the quasi-3D structures, dewetting will occur between the particles potentially leading to undesired defects. Resorting to more complex patterning techniques, or having inverted pyramids with shallow angles to space out their pit while still imposing reflow could provide for improvement. The present system and method can be adapted for the many applications where short inter-particle distances are preferred. Structures with distance down to a few nanometers are of high interest for their capability to efficiently concentrate the electromagnetic field in the inter-particle region, for applications such as Surface-Enhanced Raman Spectroscopy (SERS) or refractive index sensing. From the results shown in FIG. 1B, one could expect that depositing thicker films would increase particle size while leaving the periodicity unchanged, hence reducing inter-particle distance. Above a certain thickness however, the film randomly breaks up to form large isolated particles, impeding fabrication of small interparticle gaps by a single-step deposition and dewetting process. To alleviate this limitation, a successive dewetting scheme is proposed for the system and method, where the film is deposited in several steps with systematic intermediate annealing, as shown schematically in FIG. 3H. After the first annealing, the film has fully dewetted in the inverted pyramid structure, see for example FIG. 3I. The successive deposition and annealing steps serve the same purpose and grow step by step the nano-objects, reducing the inter-particle distance in a controlled way down to 10 nanometers. This simple self-assembly approach achieves resolutions on par with those provided by electron beam lithography, without the burden of cost and complex equipment, onto rigid and soft substrates.

Figure 4A:
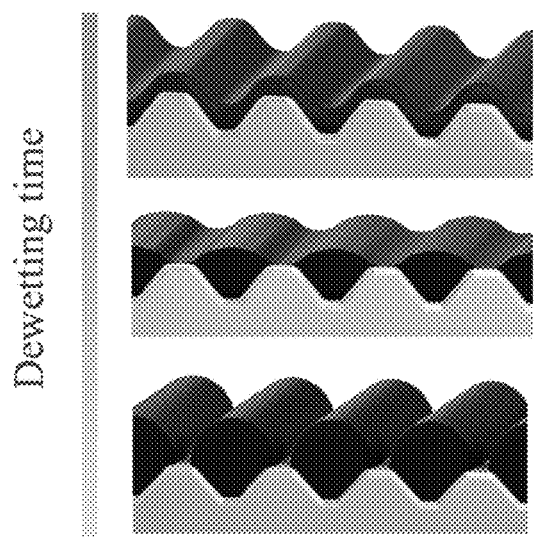
FIGS. 4A to 4C show results of the different stages of the method or process, with FIG. 4A showing a schematic illustration of continuous line formation process involving an interplay between reflow, molecular interactions and Rayleigh-Plateau instabilities.
Figure 4B:
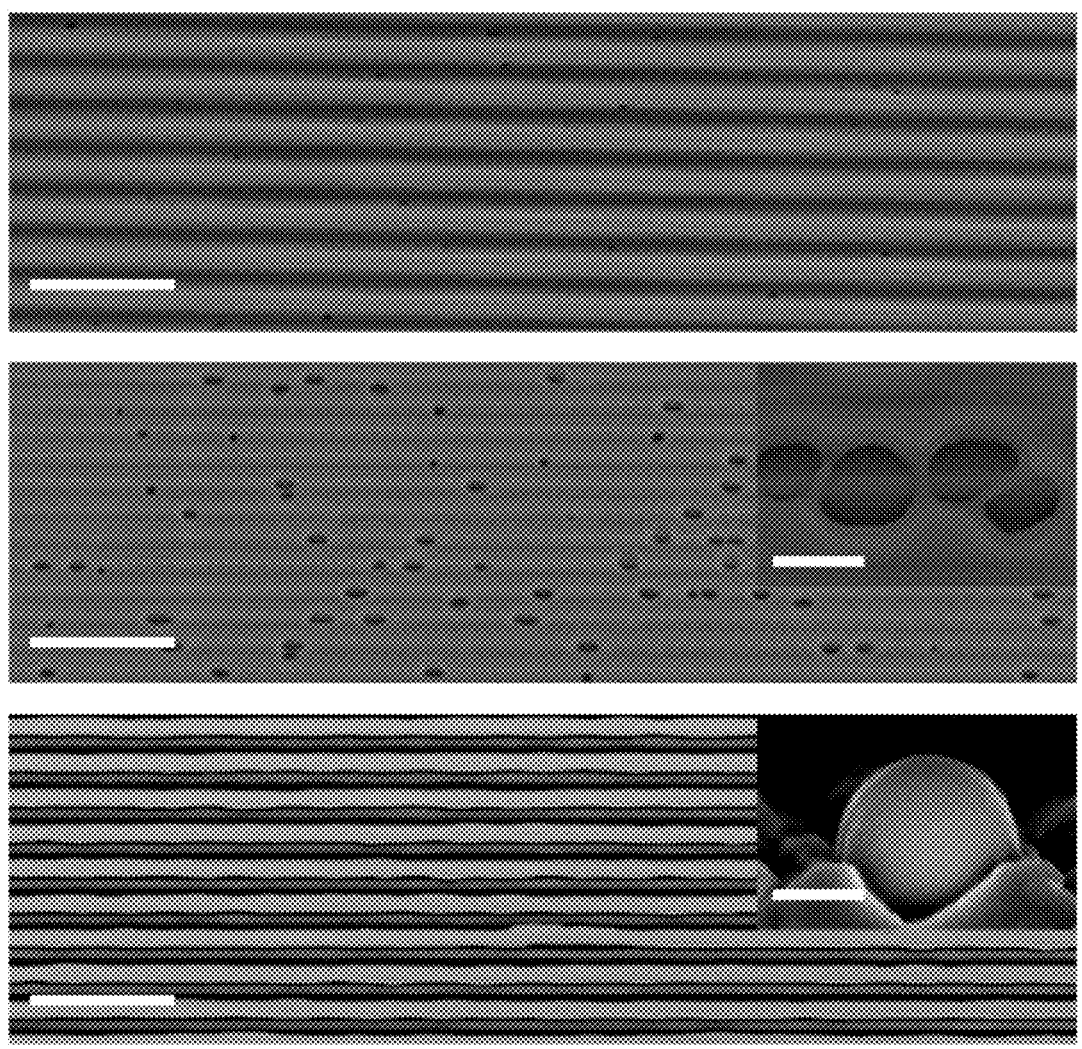

Finally, it has been demonstrate that continuous lines of optical glasses with sub-micrometer feature sizes can be obtained. To produce such structures, we take advantage of the difference in time scale between template-induced reflow, that reshapes the film into linear structures, and Rayleigh-Plateau instability, which leads to capillary break-up of lines into particles. If the time scale associated to template reflow is shorter than the one associated to Rayleigh-Plateau instabilities, the device can be frozen into metastable linear structures. The ratio between those two time scales can be tailored by playing on the film thickness, so as to prefer reflow dynamics over Rayleigh instabilities. In FIGS. 4A to 4B, we show a schematic of this principle and the SEM micrographs that show the dewetting process resulting in continuous glass lines.

Figure 4C:
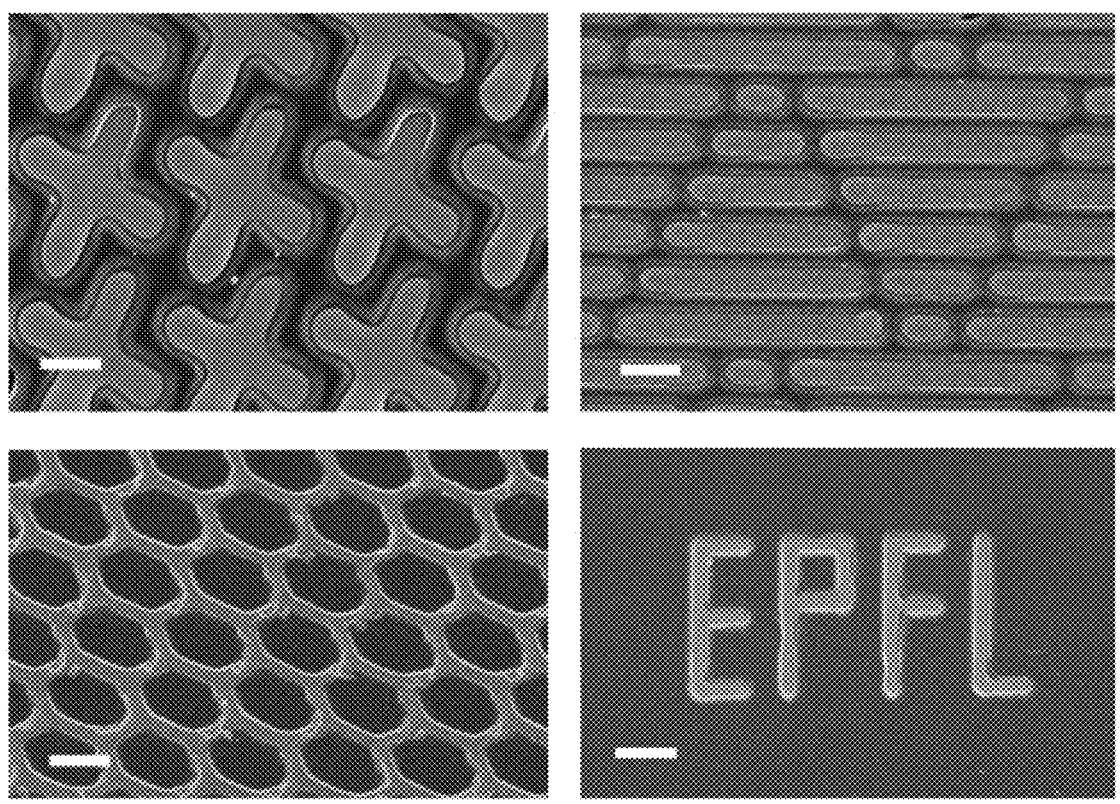
Figure 4D:
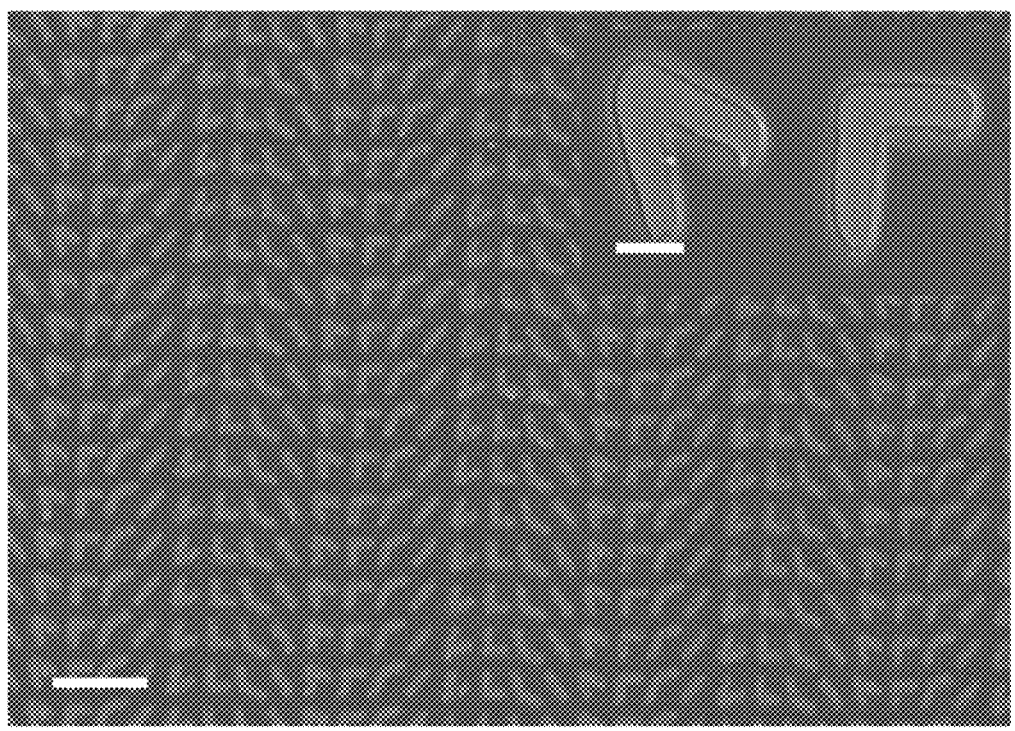
FIG. 4D shows large-area SEM image illustrating a well-known Pancharatnam-Berry metasurface structure. The scale bar is 10 µm.

Based on this approach it is possible to make shapes with a variety of aspect ratios, as exemplary shown in FIGS. 4C and 4D. In FIG. 4C, a variety of examples are shown with different geometries, such as cross arrays (top left) and a triangular metasurface (top right). More isolated structures can be fabricated by delaminating interline regions mechanically upon dewetting. With this method, the manufacturing of continuous honeycomb lattice has been shown, see for example FIG. 4C at the bottom left and an isolated EPFL logo, highlighting the possibility to realize photonic circuit designs. Moreover, as exemplarily shown in FIG. 4D, a well-known Pancharatnam-Berry phase metasurface.

Figure 11A:
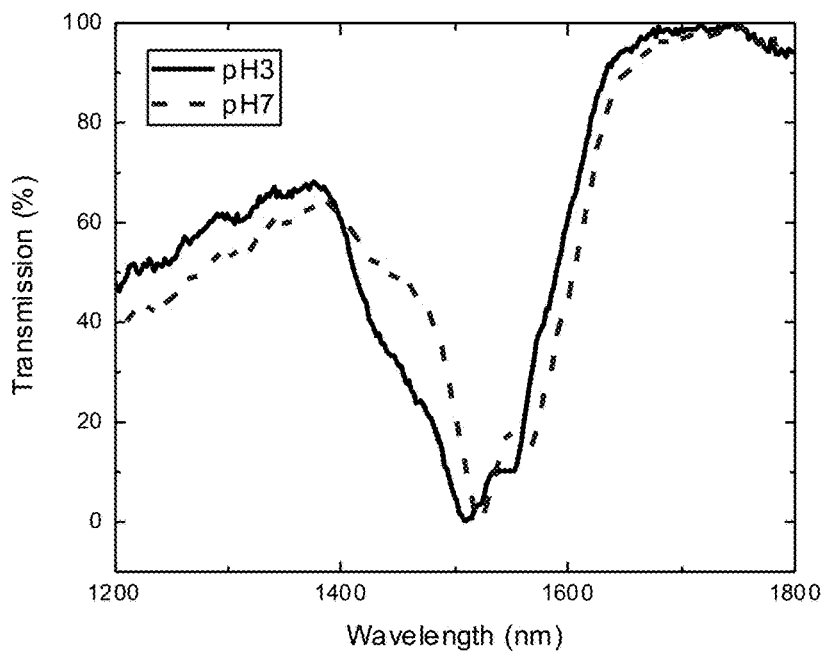
FIGS. 11A to 11C show results of the pH sensing, with FIG. 11A showing experimental change in transmission spectra of a transferred array of metasurface (here As2Se3, 1000 nm square lattice) on a pH sensitive hydrogel (pH~3 as a solid line and 7 as a dashed line), FIG. 11B showing simulated Electric field enhancement map demonstrating a field enhancement of 100 times in the transferred metasurface, and FIG. 11C showing a plot illustrating the change in wavelength as a function of the change in pH. The surrounding pH medium induces a refractive index change (~0.02 for pH change from 3 to 7) inducing a 10 nm shift in the resonance spectrum.
Figure 11B:
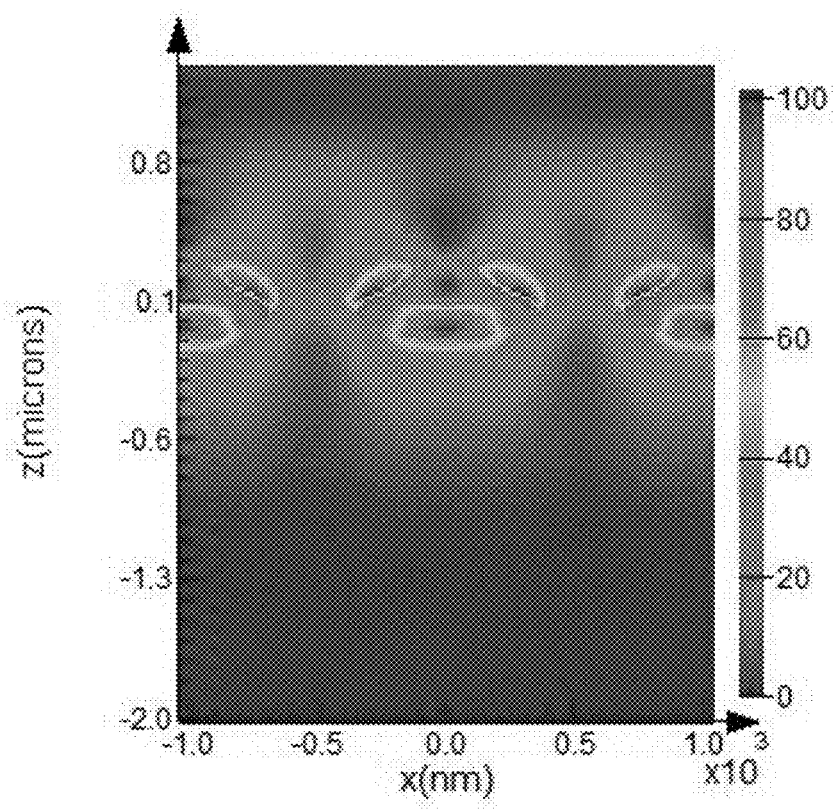
Figure 11C:
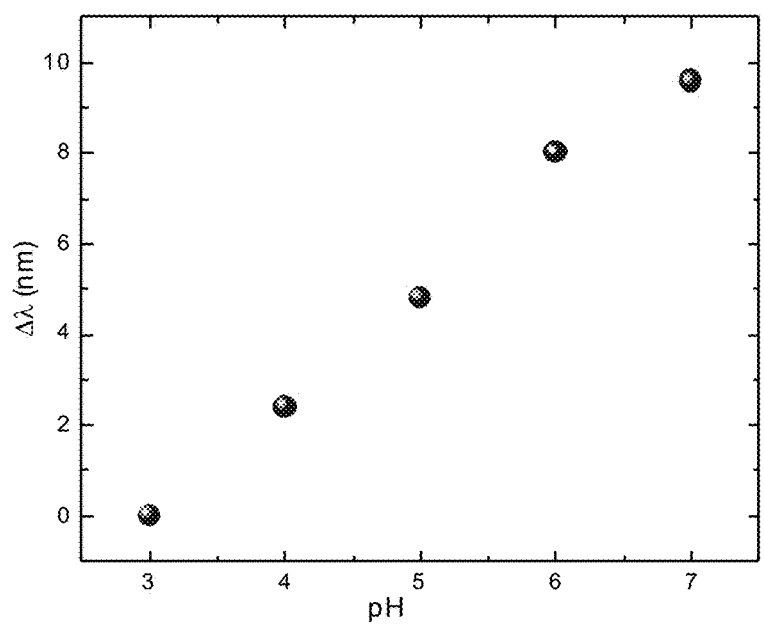

The structures produced by such engineered instabilities can be transferred onto other substrates using curable polymers. Conceptually, this is interesting because it enables to decouple array manufacturing and placement on a final device. This enables integration of metasurfaces on surfaces that might have otherwise proven difficult to pattern and dewet on. The relevance of this is shown by transferring a very low defect-density array of highly reflective $As_2Se_3$ nanoparticles from a silica substrate onto a very thin UV-curable layer at the tip of a PMMA-based optical fiber. By injecting light into the fiber and monitoring the reflected signal, the relative refractive variation of the fiber's surrounding medium can actually be quantified. The physics behind this measurement are explained in more details later on with respect to FIGS. 9A-9D. Another interesting alternative to UV curable polymers are soft, pH-sensitive hydrogels. Variation of their geometry and optical constants with pH enables interesting possibilities in metasurfaces-based pH monitoring. This point is further developed as exemplarily shown in FIG. 11A to 11C. Transfer methods from metasurfaces using curable polymers are hence another crucial point demonstrating the method versatility.

Figure 6A:
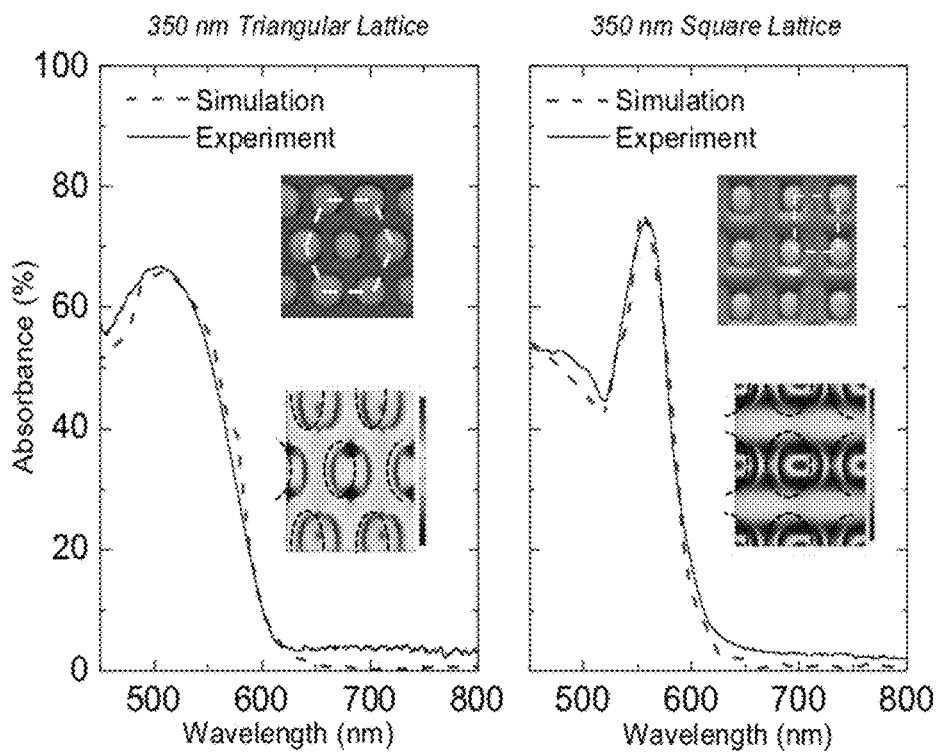
FIGS. 6A to 6D show optical properties of chalcogenide metasurfaces, with FIG. 6A showing absorbance spectra for (left) 350 nm triangular and (right) square lattice. The absorbance peak is around 80% in the visible spectrum range. Inset shows the corresponding SEM and electric field distribution at the corresponding resonances.

Examples of optical effects that can achieve with such self-assembled chalcogenide based all-dielectric metasurfaces are shown, and potential applications are discussed. In FIG. 6A, experimental and simulated absorbance spectra of selenium (Se) particle arrays on hexagonal and square lattices are shown. After dewetting a thin film (typically 30 nm), a strong absorbance peak is observed over a tunable bandwidth depending upon the initial film thickness. This absorbance peak is much higher compared to what is obtained with the initial thin film at similar wavelengths indicating that resonances appear within or between the particles. FDTD simulation demonstrates that high absorbance (over 80%) in 350 nm square lattices is due to the Mie-type resonance (electric and magnetic dipole resonance) of the nanoparticles, see the inset of FIG. 6A, while for the hexagonal lattice, the absorption is due to the combined effect of single particle resonance and an inter-particle coupling effect, see the inset of FIG. 6A on the left. It is a first interesting result that with such a minimal amount of material dewetted for a few minutes and at low temperature, such high optical absorption can be obtained over a tunable bandwidth.

Such structures can self-assemble at low temperature, but once formed, they can be quite resistant to heating. Subjecting an $As_2Se_3$ glass to 100° C. for several hours has little influence on its optical response. An encapsulating step can also be added for applications where high temperatures may be encountered via solution or physical deposition-based processes. For instance, the addition of a 100 nm $SiO_2$ layer to an $As_2Se_3$ structure subjected to 22 hours of annealing at 100° C. leads to no change in the optical response, which suggests a robust system with limited crystallization, oxidation or evaporation.

Figure 6B:
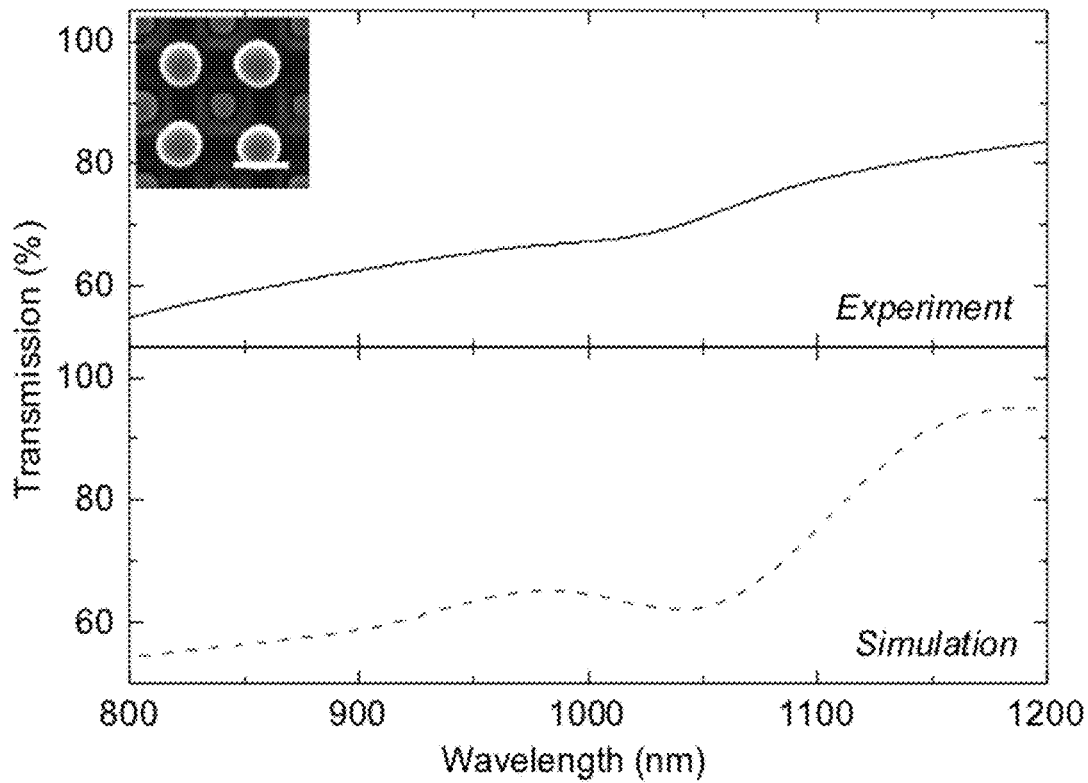

Given the ability to tune the steps of the method to low-temperatures, such non-percolated arrays of rigid particles can be applied to elastomeric substrates without impairing their mechanical attributes. Active tuning of optical spectrum by uniaxial tensile stress can then be achieved. Varying the strain from 0% to 50% induces a change in the inter-particle distance both parallel (elongation) and perpendicular (shrinkage) to the applied force. In FIG. 6B, we show the strain vs. wavelength 2D map of the optical transmission for a selenium (Se) array with the particle size: 600 nm and the periodicity: 1000 nm. The graphs of the transmission at 0% and 50% strain are also shown (right). The transmission evolves from a single dip in our spectral range (at 1425 nm) at 0% strain, to two dip resonances that red and blue shift as the strain increases (shown by arrows on the 2D plot). This evolution is fully reversible over several straining cycles (100 times at 50% strain amplitude), suggesting the absence of delamination. These shifts are attributed to the change in inter-particle distance along and perpendicular to the strain direction and hence a shift of the associated resonance. Such opto-mechanical nano-structures could have interesting applications in strain and deformation sensing.

Figure 3F:
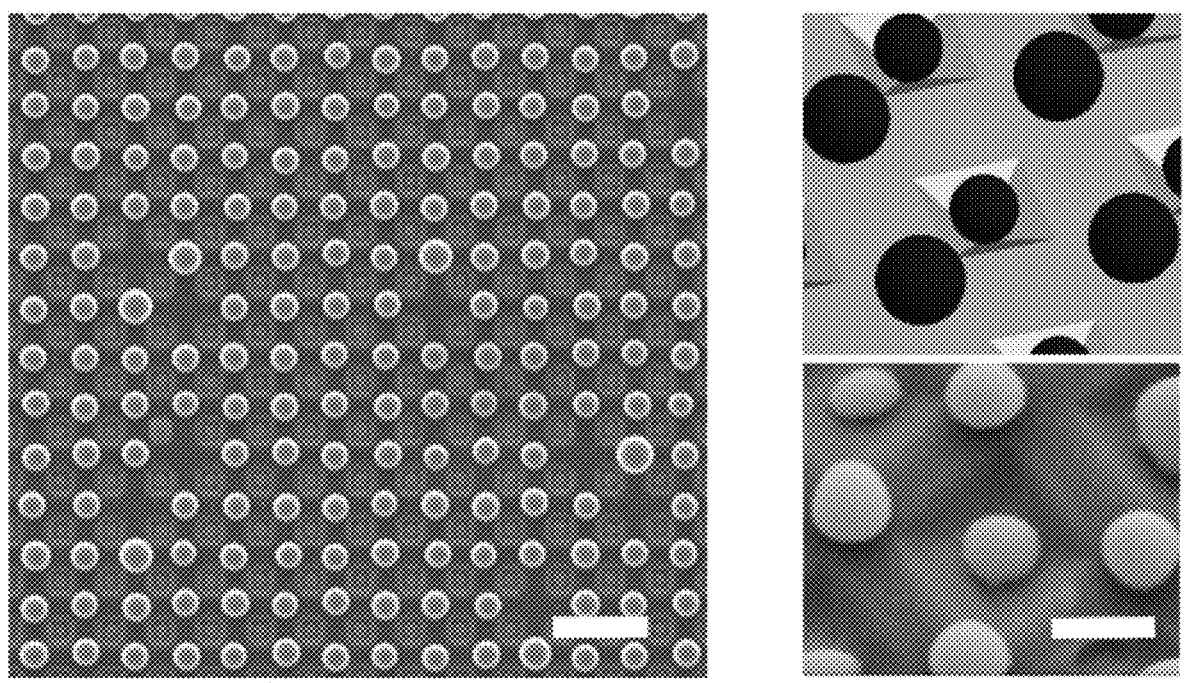
Figure 3G:
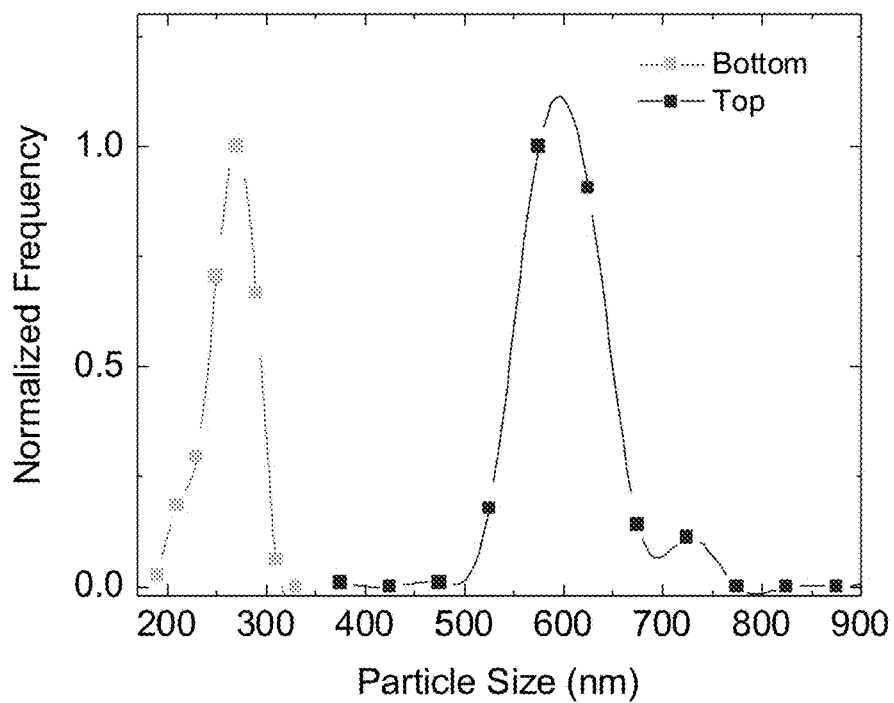
Figure 3H:
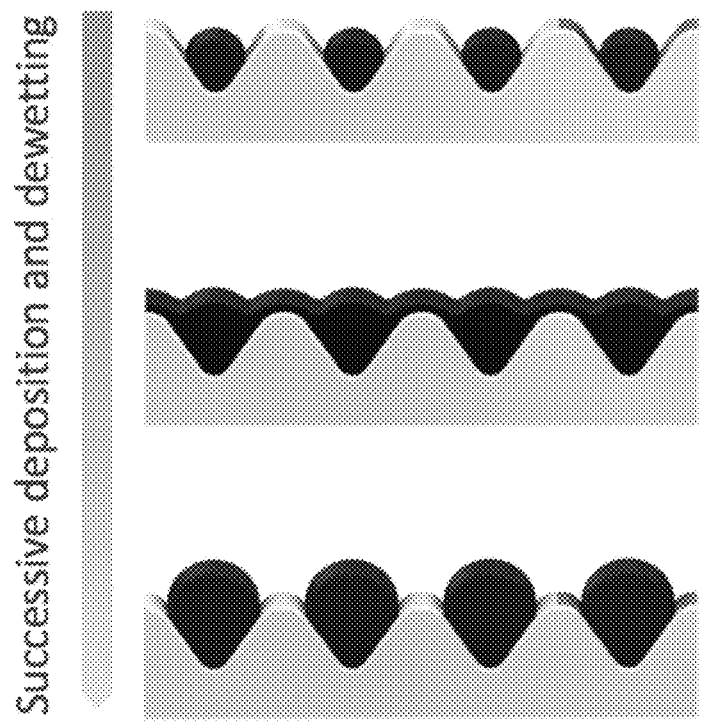
Figure 31:
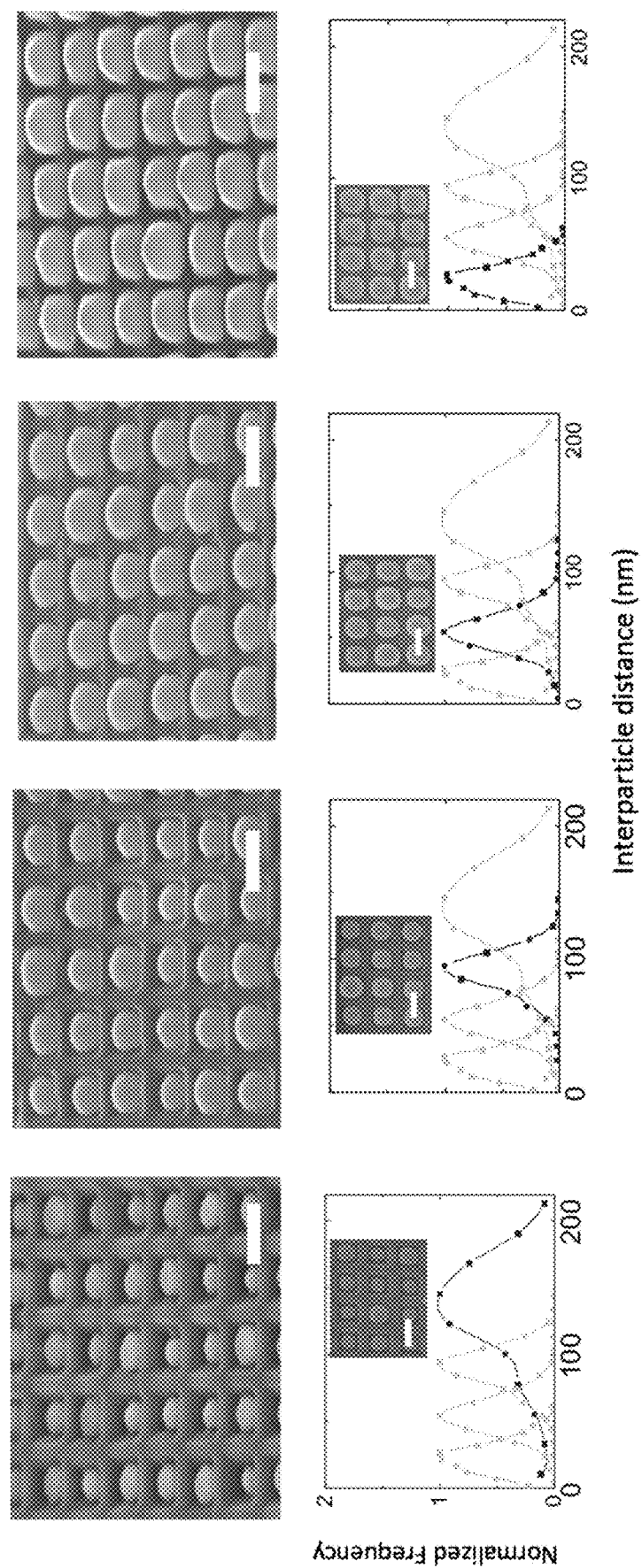
Figure 6C:
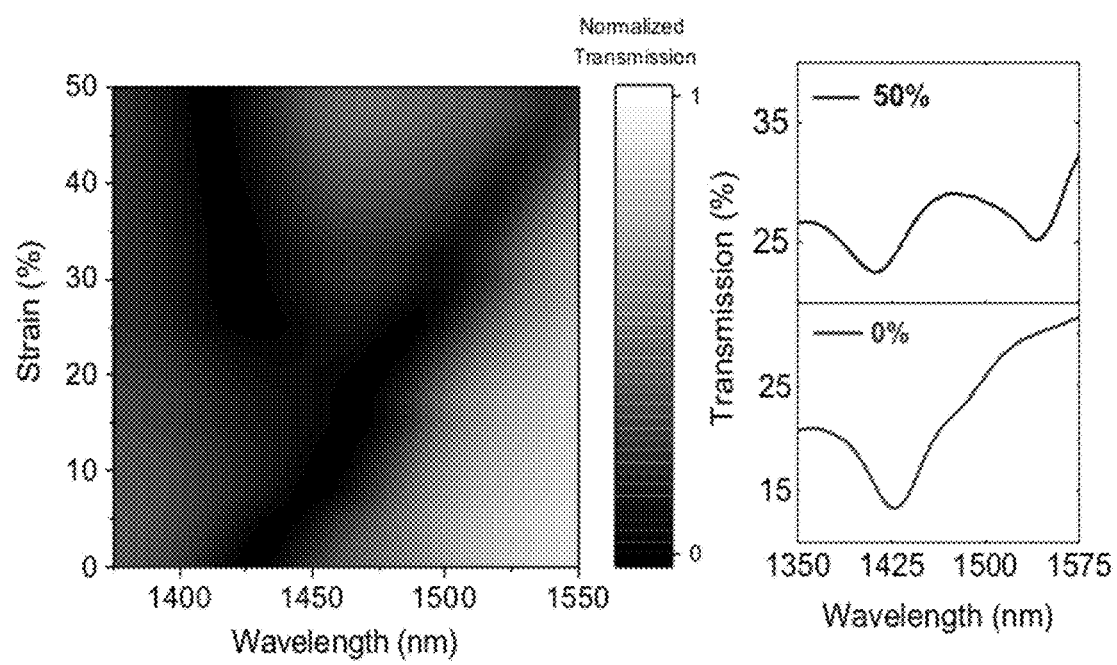
Figure 6D:
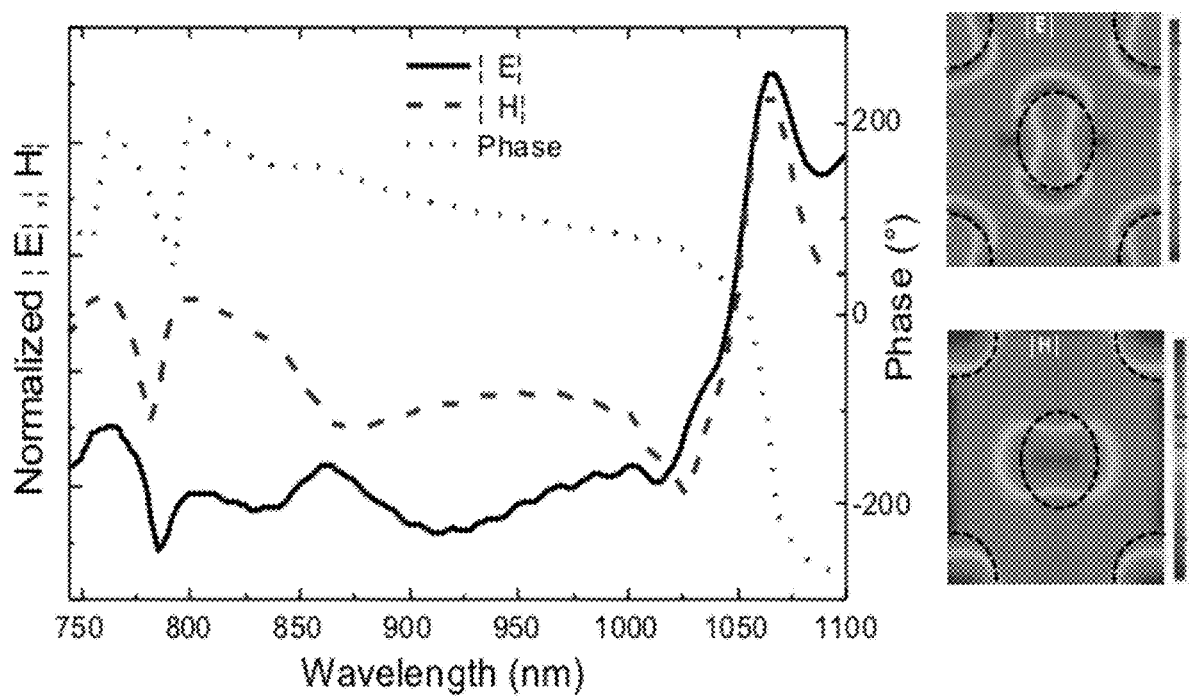

The quasi-3D arrangements exemplarily shown in FIGS. 3E to 3G show another interesting ability of phase modulation across these architectures. In FIGS. 6C and 6D, we simulated with the Lumerical FDTD solver package the complex transmission spectrum using the S parameter analyzer. The simulated architecture had a 1000 nm periodicity with 300 nm diameter of particles in the pyramid and 500 nm diameter on the mesa, as shown in the SEM micrograph inset of FIG. 6C shown on top. The simulated transmission dip position matches well with the experimentally obtained value showing a similar dip around 1050 nm in FIG. 6C. The simulated complex amplitude also yields the phase of the transmitted light beam. It shows a $2\pi$ phase change around the transmission dip. This is attributed to the overlap between electric and magnetic field, see FIG. 6D on the right, fulfilling the second Kerkers condition. Smaller phase shifts are observed at lower wavelengths, where these two resonances do not exactly coincide. On changing the architecture of the particles from a quasi-3D to a 2D lattice, the orientation changes and the spectral overlap disappears, resulting in phase tailoring over a smaller range. This tuning of the optical properties obtained simply by tailoring the template architecture and film thickness provides a simple and versatile way to control light beams over sub-micrometer thick architectures.

Figure 7A:
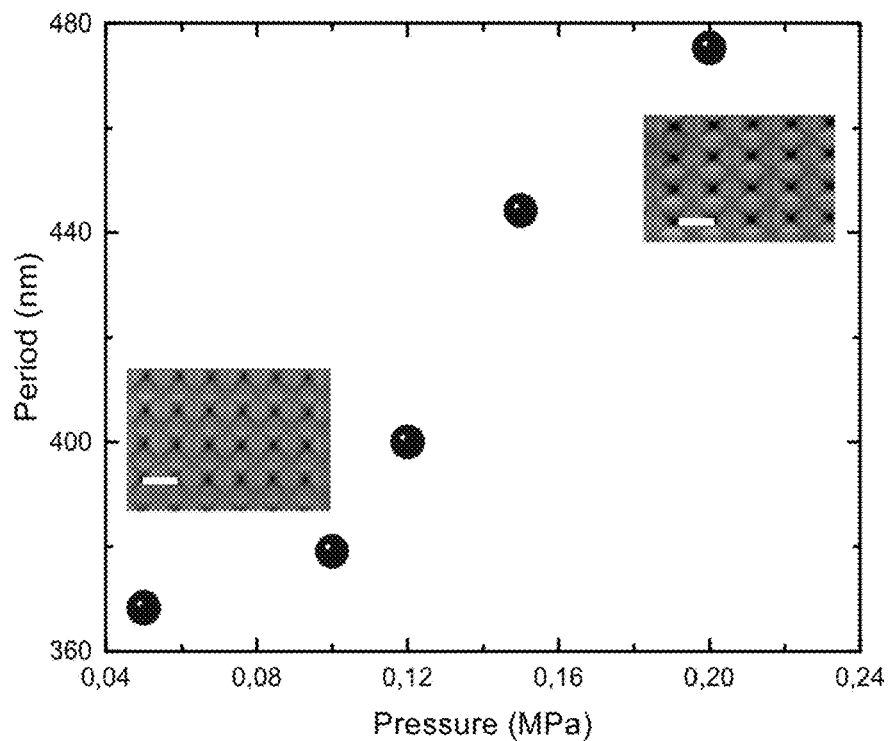
FIGS. 7A and 7B shows the different effects of tuning the nanoimprinting pressure, with FIG. 7A showing a plot illustrating the change in the lattice constant (period) with the applied pressure. In this plot, the period is defined as the direction where the maximum change in the lattice is obtained. Inset shows the SEM images illustrating the applied pressure effect during the nanoimprinting process for two different applied pressures (0.05 MPa (left) and 0.2 MPa (right)).
Figure 7B:
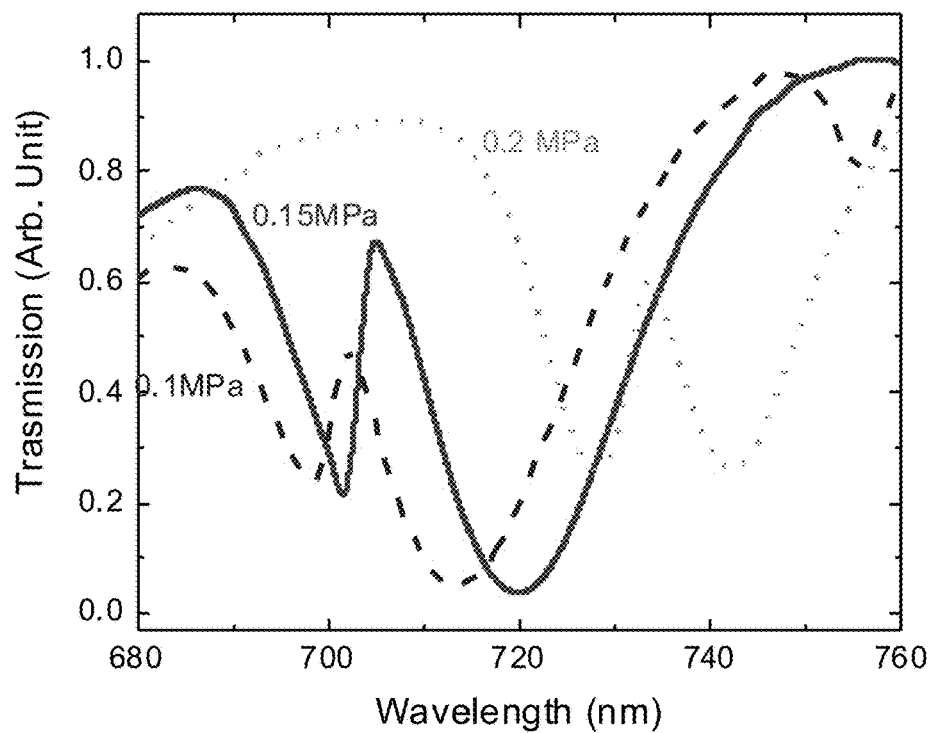

Another aspect is the effect of the applied pressure and the optical transmission properties. Specifically, tuning the nanoimprint pressure provides a simple yet efficient leverage over the nanoimprinted lattice period and dimensions. Using PDMS replica molds to nanoimprint polycarbonate substrates, a control in lattice period can be demonstrated, with an increase up to 36% of the initial Si mold period. From a fabrication perspective, this allows for extraordinary flexibility: from a single Si mold with a given period, a wide range of lattices can be fabricated, see for example FIG. 7A. From an optics perspective, this allows for finely tailored optical properties and excellent spectral resolution, see for example FIG. 7B.

Figure 8A:
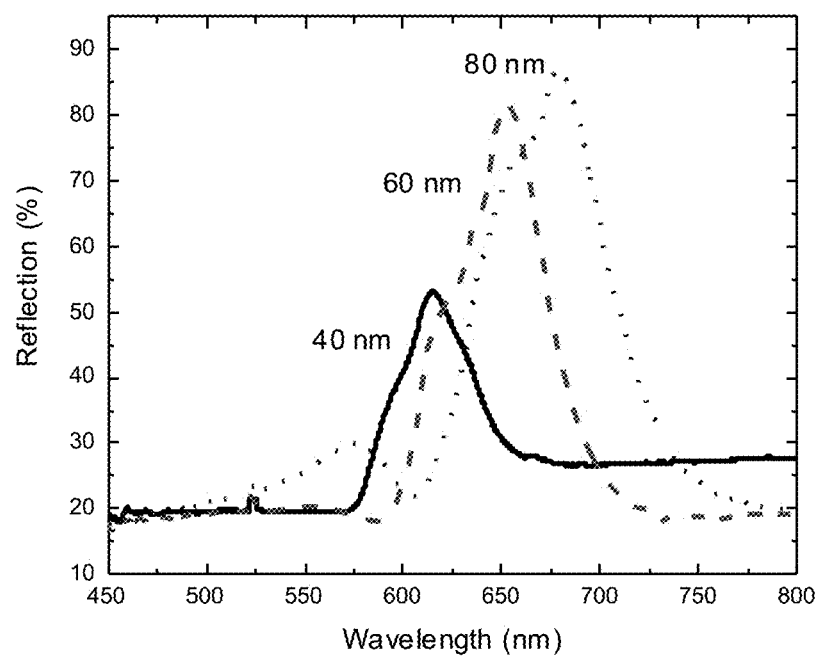
FIGS. 8A and 8B shows the tunable reflection, with FIG. 8A showing a plot demonstrating the experimental reflection spectra as a function of different final thickness. By the process of successive dewetting steps, a Reflectivity of approx. 90% could be obtained as shown in FIG. 8B, simulated reflection map demonstrating a near unity reflection for a particle size of 340 nm with an array periodicity of 350 nm.
Figure 8B:
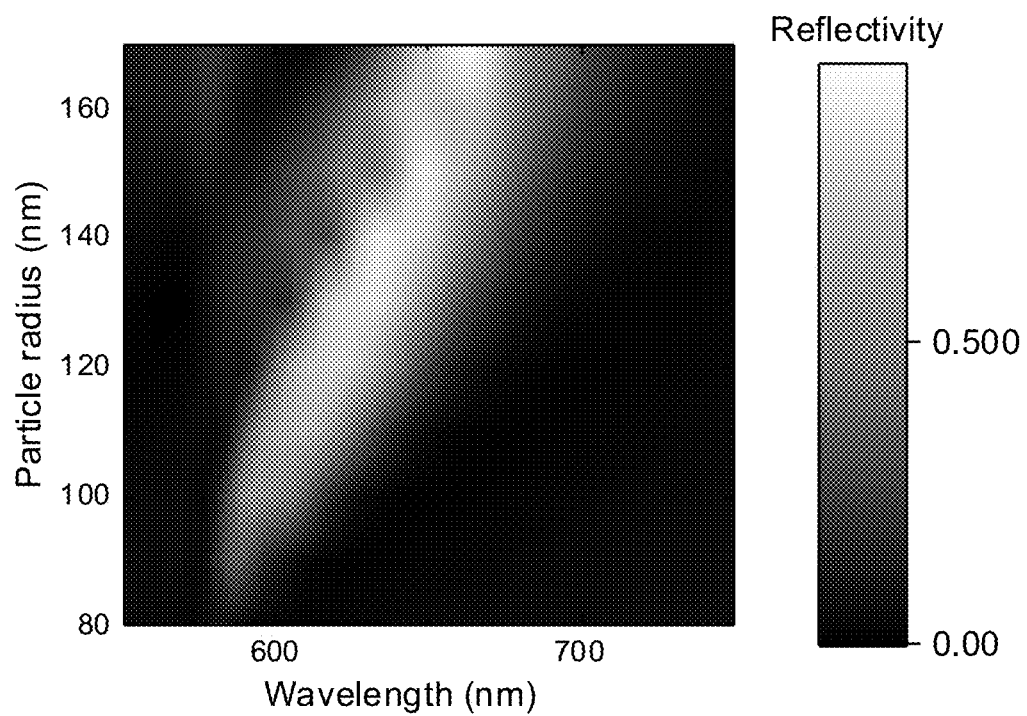

Another aspect is the use of successive dewetting of layers. This allows to fine control the interparticle distance as demonstrated in FIG. 3H to 3I, to realize optical structures with sharp Fano resonances by the successive dewetting. A 350 nm square array of Se nanoparticles on polycarbonate substrate with varying interparticle distances has been analysed. This metasurfaces exhibits a reflection nearing 90% for sufficiently large particle size, which are only accessible by successive dewetting. This is due to the full-backward scattering of the array, as shown by experiment of FIG. 8A and the simulation FIG. 8B.

Figure 9A:
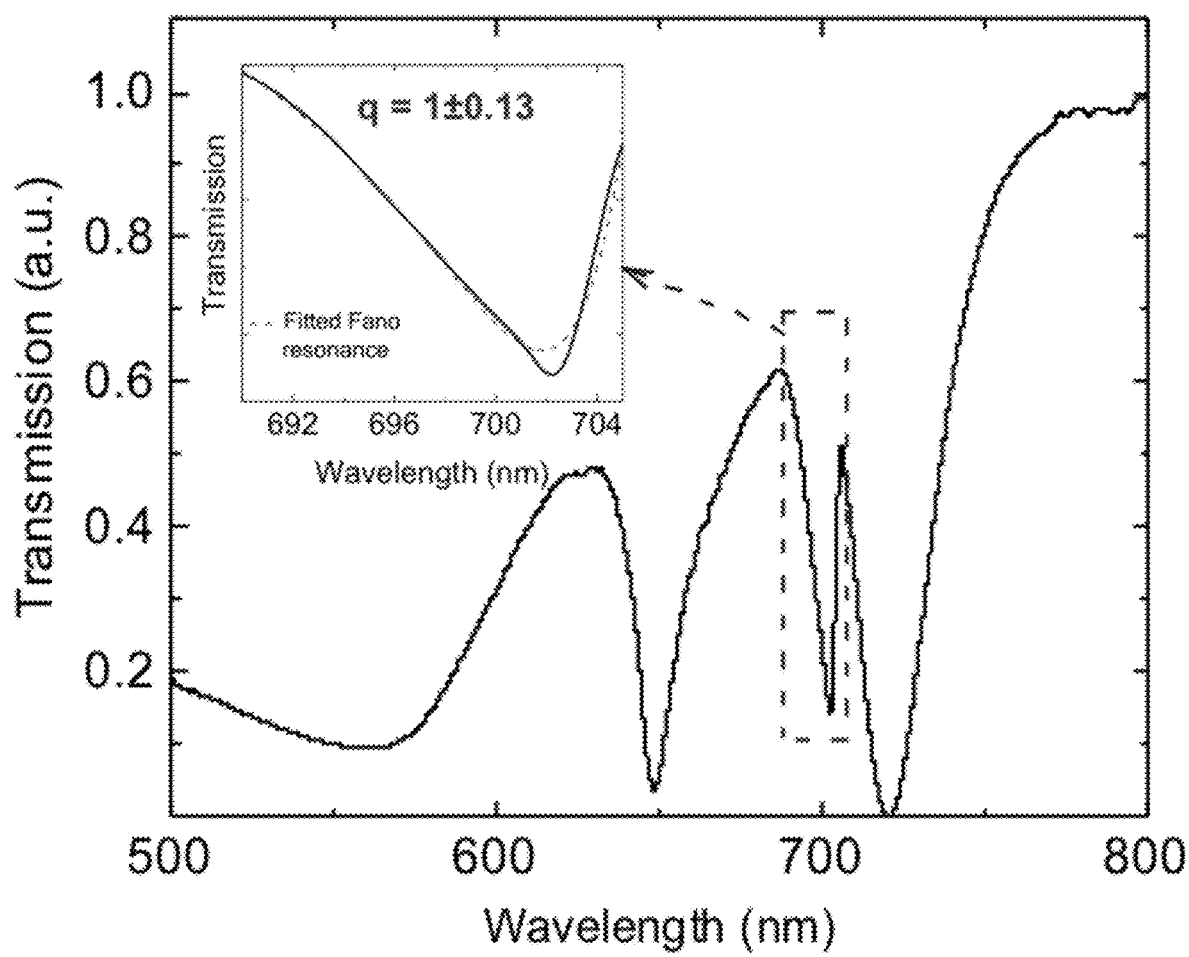
FIGS. 9A to 9D show optical transmission spectra for a successively dewetted film (interparticle gap~30 nm) showing an asymmetric sharp Fano resonance. Inset shows a zoom on the asymmetric resonance fitted with the Fano formula. The fit yields a q value of ~1, indicating a Fano resonance.
Figure 9B:
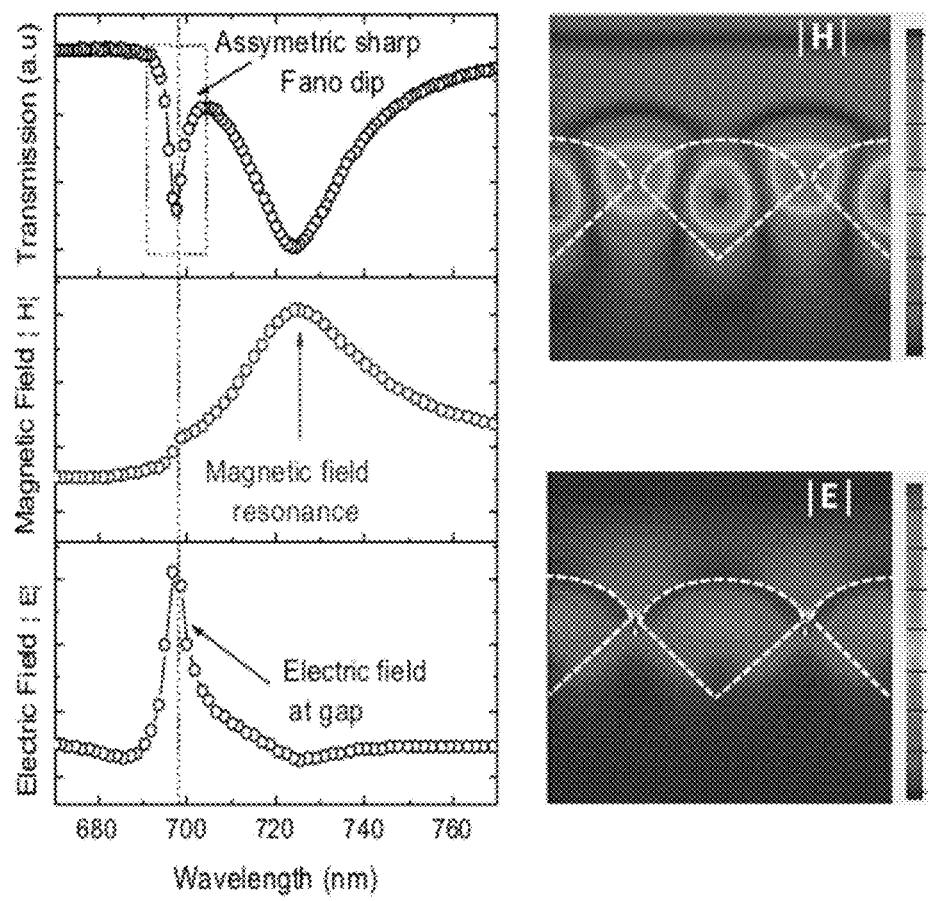

In the same structure, we observed a sharp Fano-type resonance in transmission, see for example FIG. 9A. Fitting this dip with the analytical expression of the Fano formula, we found a Fano parameter |q| equal to 1, with a corresponding mode's Full Width Half Maximum (FWHM) of 4 nm and a Q.F of ~175 at 702 nm, for light incident in air. Similar samples coated with a polystyrene layer (refractive index~1.6) exhibited even sharper dip, corresponding to a FWHM of 2.5 nm with a Quality Factor (Q.F) of ~293 experimentally and a FWHM of 2 nm with a Q.F of 367 by simulation, thanks to index matching with the substrate. The Fano parameter q determines the coupling efficiency between a discrete (sharp resonance) and a broad continuum. The resonance observed corresponds to the weak coupling regime as shown by simulation: when the coupling increases (inter-particle distance decreases), the q value progressively diverges to infinity (strong coupling) and the line shape becomes Lorentzian. To elucidate the mode components of the Fano resonance, we extracted the electric and magnetic field maps at the resonance wavelength using FDTD numerical simulation. FIG. 9B shows that, with a 30 nm interparticle gap, the Fano resonance appears due to the interference between the broad magnetic resonance (arising from the combination of the lattice resonance and the particle magnetic dipole resonance) and the sharp inter-particle gap electric resonance, as supported by the electric field distribution plot. The transmission spectrum obtained by simulation is in agreement with the experimental spectrum shown in FIG. 9A.

The sharp Fano resonances that could be achieved in the visible are a result of the particular architecture of the self-assembled arrays, but also of the lower optical losses of some Chalcogenide glasses, including Selenium, in this spectral regime compared to conventionally used materials such as Si. Nanostructures with such high quality Fano resonances open novel opportunities in the design of sensing platforms in the visible. Sharp photonic resonances are particularly relevant for refractive index sensing applications, whereby deposition of a material of different refractive index on the dielectric metasurface induces a global shift in the transmission spectrum. To determine the metasurface's bulk refractive index sensitivity, which corresponds to the shift in resonant wavelength $\Delta\lambda$ induced by a change in refractive index of a thick superstrate covering the metasurface $\Delta n$ $$\left(S_{bulk} = \frac{\Delta\lambda}{\Delta n}\right),$$

we monitored the sharpest resonances in transmission of Se 350 nm square arrays with varying interparticle gaps upon drop-casting of different solvents with changing refractive indices. The experimental results indicate that lowering the inter-particle gap increases the $S_{bulk}$ value up to a saturation gap distance of 30 nm. Moreover, it could be observed that the red-shifted spectrum recovered its original position after the solvents were removed. This ensured no irreversible modification of the metasurface and that the shift was due only to the surrounding index change. A maximum $S_{bulk}$ value of 150 nm/RIU with a Q.F of ~175 for the 30 nm gap configuration could be obtained.

Figure 9C:
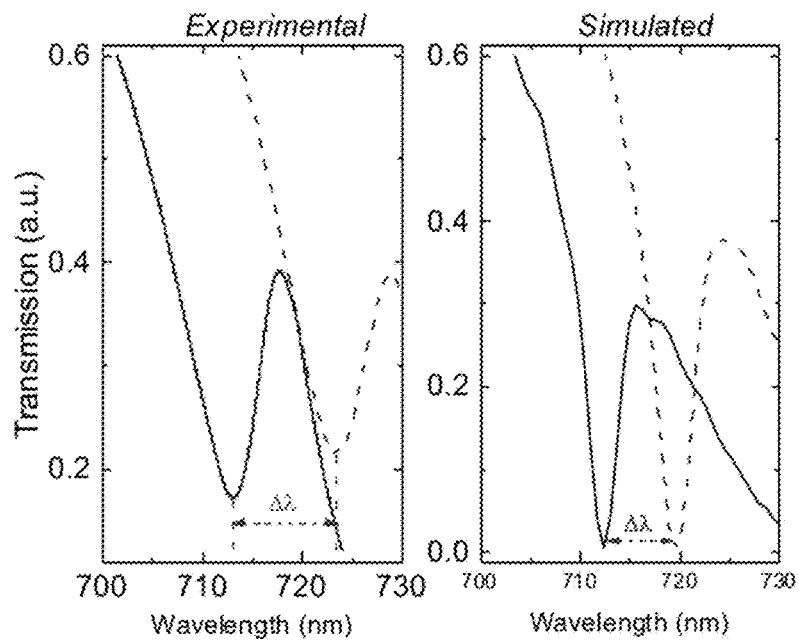
Figure 9D:
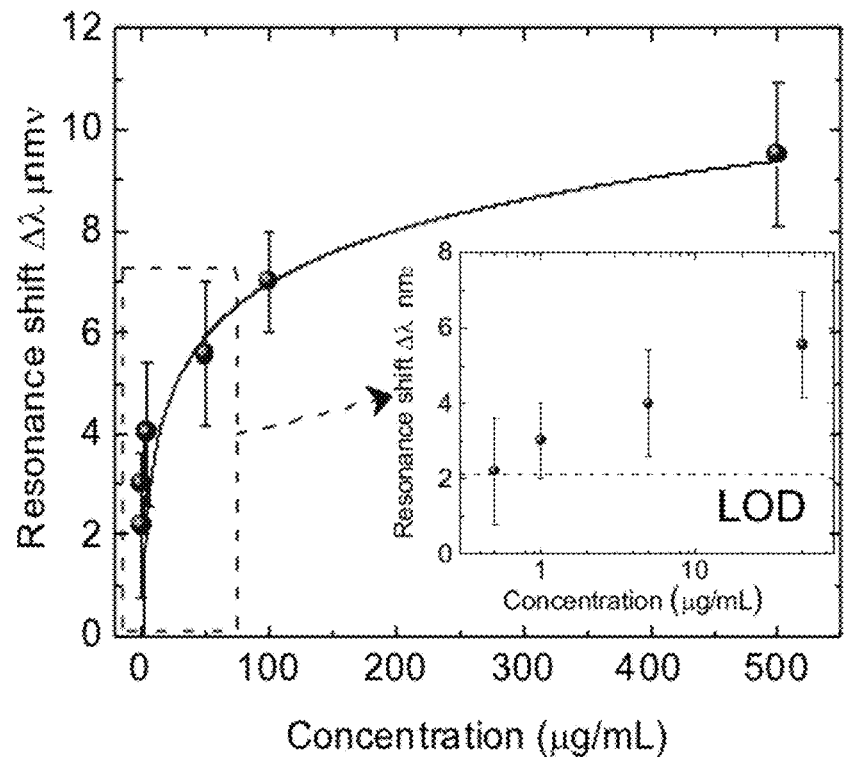

The bulk sensitivity Figure of Merit (S/$\Delta\lambda$~38 in air and 75 using index matching condition) of such metasurfaces is comparable with existing designs. The field being strongly confined at the surface in the structured device, it is particularly relevant to investigate its sensitivity to monolayers rather than bulk index changes. The enhanced near fields associated with the resonance modes can effectively probe the refractive index changes due to the local biomolecule accumulation on the sensor surface. The simulation results of FIG. 9B show a strong enhancement of the electric field intensity (over 100 times) within the confined interparticle region, and therefore sensitive to local index changes. To demonstrate the bio-sensing capability of the proposed nanophotonic device, we simulated and experimentally measured the spectral variations in the presence of protein A/G (recombinant fusion protein with protein A- and protein G-binding sites) monolayers. For simulation, a 10 nm layer of protein (n=1.5) was considered to be homogeneously distributed over the Chalcogenide metasurface. This yields an 8 nm spectral shift that is depicted in FIG. 9C compared to a bare structure. In the experimental study, we incubated the Se nanoparticle arrays with various concentrations of protein A/G solutions, and measured the spectral shifts induced by the physio-adsorbed protein monolayers, see for example FIGS. 9C and 9D. A spectral shift of 10 nm was observed for a concentration of 500 μg/mL. The experimental data collected for different concentrations result in a calibration curve that saturates for higher concentration ranges (>500 μg/mL), which is typical for surface sensors. The Limit of Detection (LOD) of the experimental method was also calculated. The intersection of the fitted saturation curve to the LOD yields the minimum detectable protein concentration, which can be evaluated to 0.5 μg/mL. This value is comparable with state-of-the-art plasmonic-based devices as shown in FIG. 9D.

Figure 10A:
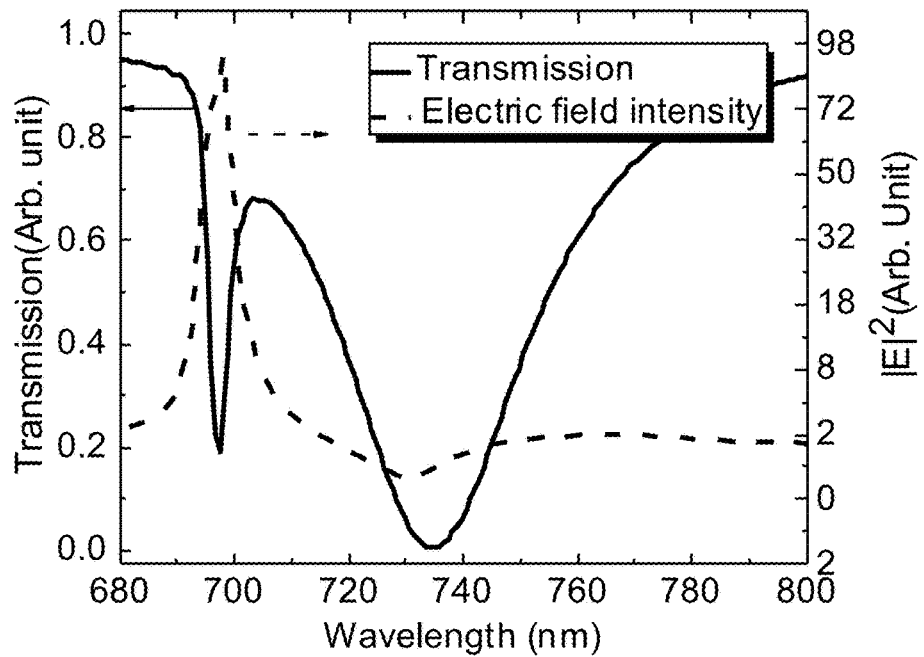
FIGS. 10A and 10B shows second harmonic generation, with FIG. 10A showing simulated transmission (solid line) and electric field intensity enhancement (dashed line) for a Se metasurface, and FIG. 10B showing experimental transmission (solid line) and normalized SHG (the dots) signal. The SHG signal is experimentally observed to be 100 times enhanced as suggested by the field enhancement at the fundamental wavelength.
Figure 10B:
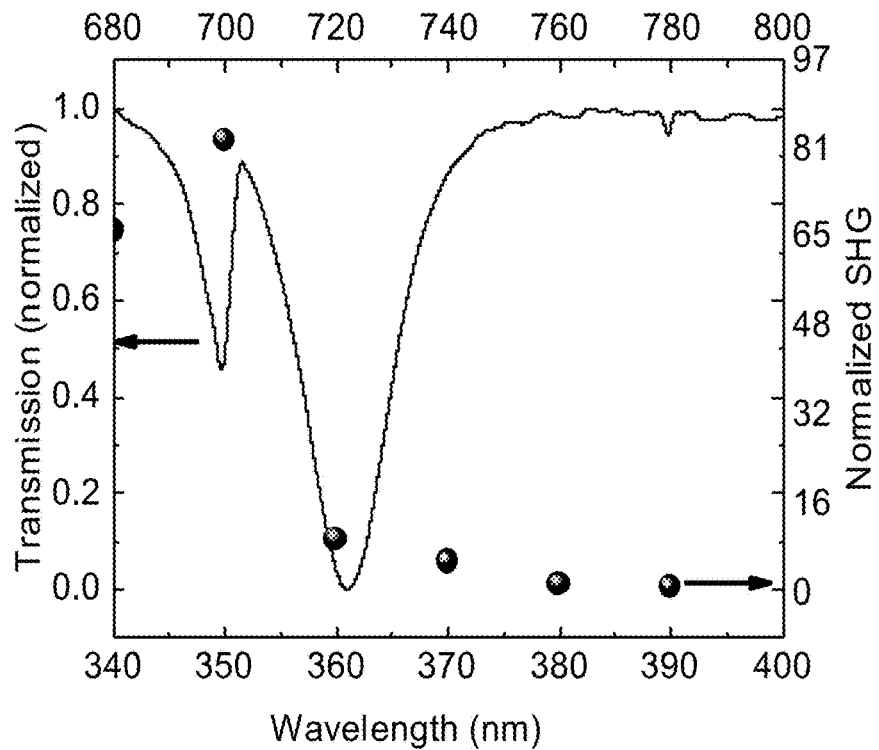

Taking advantage of strong field enhancement also enables resonantly enhanced second harmonic generation (SHG), which we demonstrate by simulation as exemplarily shown with FIG. 10A and experiment in FIG. 10B. This can be use as flexible light source. Applying the processing principle to non-centrosymmetric materials could allow for much higher SHG conversion efficiency. For THG, chalcogenides have singularly high intrinsic third order susceptibility, making particularly good candidates for such applications.

With the Optical properties of the transferred particles, pH sensing would be possible. Field enhancement within pH-sensitive materials enables interesting monitoring possibilities, and a possible manufacturing of elements of a pH sensor. As pH varies, the index of the hydrogel substrate changes ($\Delta n=0.02$ for pH increasing from 3 to 7). Considering an $As_2Se_3$ metasurface on this hydrogel with fixed lattice (hydrogel on glass), we can monitor index change within the hydrogel using a field intensity of up to 100 times, see FIG. 11A. Using a freestanding hydrogel, the change in pH also induces a change in lattice periodicity, further increasing the sensitivity of the device.

By exploiting for the first time the template-assisted dewetting of chalcogenide glasses, we have shown a simple and scalable fabrication technique to realize state-of-the-art all-dielectric metasurfaces. Using this new class of materials enable significant breakthroughs in surface optics on two fronts: first, glasses and particularly Chalcogenide glasses can be tuned to exhibit low losses in the visible range, which can lead to sharp resonance in a spectral region unexploited before by dielectric metasurfaces. Second, their ability to flow in their glassy state allows for a self-assembly based process and the simple deployment of complex nanostructures over large area, flexible and stretchable surfaces. We showed that the Navier-Stokes theory provides fundamental understanding of the Chalcogenide dewetting process that can be controlled to realize complex architectures with nanoscale feature sizes. Through this process, quasi-3D structures that show phase control over a broad range greater than π are obtained. By successive dewetting of thin chalcogenide layers, particle arrays with gap distance tunable down to 10 nm were also achieved, leading to Fano resonances with unprecedented Q.F in the visible. This process could possibly be further extended to multi-layer structures, for example by transfer method or by dewetting successively thin-films of different materials. This combination of novel materials and innovative processing opens novel opportunities for all-dielectric metasurfaces in sensing, bio-detection, as well as energy harvesting, flexible photonics and flat optics.

Next, the manufacturing of a sample is explained, as an example of the method and system described herein. An array of inverted pyramids with various periods and sizes is obtained by KOH etching on silicon wafers using a mask realized by laser interference lithography (CEMITEC, Spain). The more complex structures described in FIG. 4 were obtained on silicon wafers using photolithography (Laser writer Heidelberg VPG200, UV-light source, $\lambda=355$ nm) followed by dry etching (STS Multiplex ITP etcher). These master Silicon molds are then reported on a Polydimethylsiloxane (PDMS) stamp. A UV-curable polymer (mrUVCur-06 from Microresist GmbH, Germany) is deposited by spin-coating on a glass substrate. This polymer layer is imprinted using the PDMS stamp while illuminated by a UV lamp to induce polymerization. Alternatively, a thermoplastic free-standing sheet, or spin-coated polymer layer can also be imprinted via heating above its glass transition temperature while pressed against the stamp. The PDMS stamp is then removed and a hard patterned polymer layer is obtained. The thin film of ChG is then deposited by thermal evaporation (Oerlikon UNIVEX 250, Germany). Annealing is achieved on a hot plate (Isotemp Fisher Scientific) to obtain the dewetted nanostructures.

According to an aspect of the present invention, systems are provided that can perform the steps of the method. For example, for the stamping of a substrate, for example a soft polymer substrate, a system can be provided that includes a stamp or a press configured to imprint a textured surface into a substrate to form a textured substrate, a thin-film deposition device, for example but not limited to an evaporation deposition machine, configured to deposit a thin layer of chalcogenide glass onto the textured substrate, and a heating device, for example an annealing chamber, heating place, or furnace configured to anneal the thin layer to induce a dewetting of the textured substrate to break up the thin layer to an array of dispersed and self-ordered nano-objects. In a variant, instead of the stamp, other devices can be provided to generate a structuration to a substrate, for example but not limited to a laser photolithography device and an etching device, for example a reactive ion etching device.

As another example, a large scale imprint has been made by the method, being the Large-scale "EPFL" logo metasurface. The large scale structure shown in FIG. 1C was achieved by soft lithography (Thermal nanoimprinting) by assembling and embossing simultaneously a large amount of PDMS molds. PDMS stamps reproducing the same 350 nm square periodic lattice were stitched by hand to reproduce the EPFL logo shown.

Next, experimental determination of the time constant τ has been made. To measure the time constant τ associated with dewetting discussed in the top of FIG. 2B, we annealed the samples with an hot plate. The temperature was monitored with an IR camera (FLIR T450sc, Sweden) and used a CCD camera to extract the color evolution over time at constant temperature T. Experiments were done on a patterned polymer substrate with a spatial period of 350 nm, and the selenium deposited had a thickness of either 10, 20 or 25 nm. The videos obtained with the normal camera was analyzed using the MATLAB™ software, in which an image can be converted to three arrays of values corresponding to the three primary colors red, green and blue (RGB) of the pixels. To study the change of color of the sample, the average value of each of the three primary colors over a large area of the sample is computed from a single frame. The relative change of this value is then plotted versus time. It was found that an exponential decay fitted well the plots obtained after a fluctuating stage. From the three primary colors, three values of a time constant τ can therefore be obtained from each sample. The resulting values of τ match within 10% most samples and temperatures (but could be more dispersed when the color change was not smooth). The three values obtained are then used to calculate an average value of τ and a 95% confidence interval.

Volume conservation analysis is done using top-view SEM images (Zeiss MERLIN) and an image analysis software (ImageJ), assuming that the particles take the shape of the inverted pyramid as suggested by the TEM cross section in FIG. 1A, and that the top part assumes a half-spherical shape as shown in the titled SEM micrograph of FIG. 1A. Other plausible assumptions on particle shape such as a cone-like shape, yielded almost identical results concerning volume conservation. To evaluate as-deposited film volumes, we simply multiplied the deposited film thickness by the considered area, assuming a uniform and well-defined thickness from our calibrated evaporation set-up. The error was neglected on the thickness value compared to the error on assessing the volume of nano-objects. To evaluate the particle volumes, it was assumed that a perfect transfer of pattern between the silicon master mold and the nanoimprinted substrate, so that the volume of the pyramid is known. We then assessed the surface areas $S_i$ covered by a large number (i>150) of particles using image analysis of top view SEM images. From $S_i$, we can simply extract the radius of the top half-sphere for each nano-object, compute its total volume, and add them up to get the total particle volume within the analyzed image. The error bar stems from the uncertainty in measuring $S_i$, and not from the particle size distribution.

The optical properties of the structures were studied using absorbance spectroscopy. The reflection and transmission spectra of samples were determined using an integrating sphere (Ocean Optics) between 400 nm and 800 nm coupled to a detector (USB2000+VIS-NIR-ES from Ocean Optics). Absorbance in percentage of the incident intensity is calculated as $A(\lambda)=1-R(\lambda)-T(\lambda)$, where A, R and T are the fraction of light intensity that are absorbed, reflected and transmitted by the sample respectively, and λ is the wavelength. In this wavelength range, we have considered the glass and polymer substrate to exhibit negligible absorption compared to Selenium (Se).

Transmission measurement was performed using customized optical system (Ocean Optics detector NIRQUEST) to demonstrate the tunability of the metasurface under application of uniaxial strain, to analyze stretchable optical characterization. Unpolarized light source was used to observe simultaneously the optical response transverse (compressive stress) and longitudinal direction (tensile stress) of the applied strain. The transmitted light was collected and measured by a fiber-coupled spectrometer (Ocean Optics). A bare PDMS substrate was used as reference.

The fabricated Se metasurfaces are spectrally characterized using an imaging spectrometer (IsoPlane 320, Princeton Instruments, Trenton, N.J., USA), which is directly coupled to the outlet of a Nikon (Tokyo, Japan) Eclipse-Ti inverted microscope. The transmission spectra of the metasurfaces are recorded under normal white light illumination and examined for the resonance position and bandwidth validation. To evaluate the biosensing capability and protein detection capabilities of the herein proposed nanophotonic devices, protein monolayers are formed over the sensors using noncovalent physicochemical adsorption. First, the sensors were incubated with protein A/G (recombinant fusion protein with protein A- and protein G-binding sites) solutions of different concentrations in 10 mM acetate buffer (pH 4) solution. After 1 h incubation, the nanoarray were rinsed in phosphate-buffered saline (PBS, pH 7.4) solution for 5 min under constant agitation to remove excess proteins, then rinsed in MilliQ water and dried. The transmission spectra of the sensors before and after protein A/G deposition is compared to extract the spectral shift in the resonance wavelengths as detection signal.

For the SEM and TEM samples making and characterization, all the SEM samples were coated with a 10 nm carbon film. The SEM images were taken with a Zeiss Merlin field emission SEM (Zeiss, Germany) equipped with a GEMINI II column operating at 3.0 kV with a probe current of 120 pA. The TEM samples were prepared by embedding them in epoxy resin followed by sectioning thin slices (60 nm) using ultramicrotomy (diamond blade) which were transferred on a carbon/Cu grid support (300 mesh). The TEM images and SAED patterns were taken using a Talos F200X operating at 200 kV.

Figure 5A:
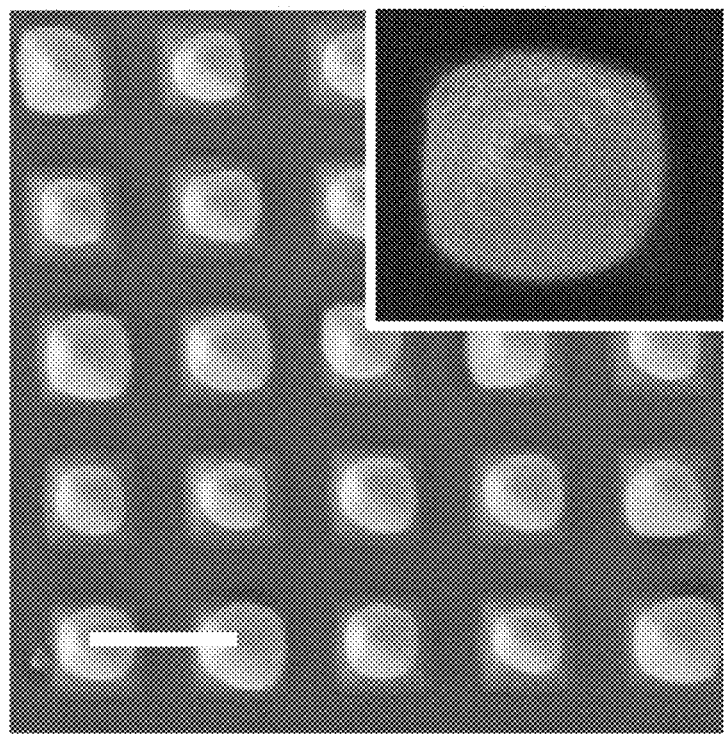
FIGS. 5A and 5B show results of the transferred process: SEM image demonstrating a 1000 nm $As_2Se_3$ metasurface transferred on a UV curable resin over a fiber tip is shown in FIG. 5A, and a pH-sensitive hydrogel. Scale bar is 1 µm is shown in FIG. 5B. The inset highlights the maintained pyramidal structure of the nanoparticles during the transfer process for the UV curable resin.
Figure 5B:
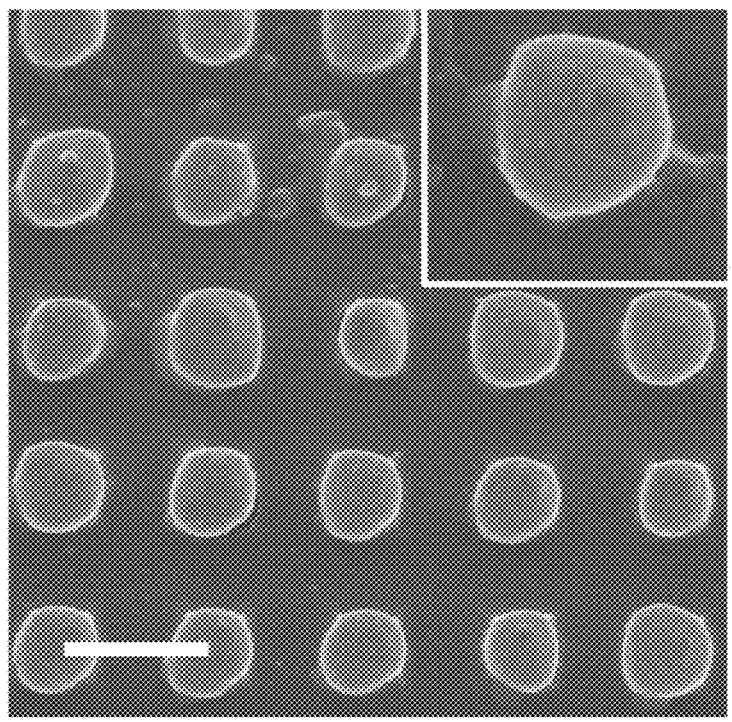

As discussion above, non-limiting examples of application and fields of use of the method and system include but are not limited to mechanochromic sensing by using sensing deformation through a change in lattice parameters using a stretchable substrate for tensile deformation or a flexible substrate for bending deformation, as illustrated exemplarily in FIGS. 5A and 5B, field-enhancing metasurfaces for: example for bio-sensing to change in superstrate refractive index changes optical properties of the sample. This can for instance be used to detect trace molecules at very low concentration of 0.5 ppm, as exemplarily illustrated in FIGS. 6A-6D. Other application can include second harmonic generation: through field enhancement at the particle's surface, the second harmonic signal can be largely enhanced. For selenium (Se), the conversion efficiency is $10^{-6}$, but could be much higher using non-centrosymmetric materials, phase-controlling metasurfaces, Pancharatnam-Berry phase metasurface, as exemplarily illustrated in FIGS. 4A to 4D, Huygens metasurfaces, as exemplarily shown in FIGS. 3A to 3I, with some quasi two-dimensional (2D) structures, highly reflecting arrays with over 90% reflection at a selected wavelength, using Kerkers second condition by crossing of electric and magnetic resonances, high-absorption arrays, using Mie resonances for sensing or energy harvesting, for example but not limited to phase changing materials for optical memories, and photonic circuits.

The present description is neither intended nor should it be construed as being representative of the full extent and scope of the present invention. The present invention is set forth in various levels of detail herein as well as in the attached drawings and in the detailed description of the invention and no limitation as to the scope of the present invention is intended by either the inclusion or non inclusion of elements, components, etc. Additional aspects of the present invention have become more readily apparent from the detailed description, particularly when taken together with the drawings. Moreover, exemplary embodiments have been described to provide an overall understanding of the principles of the structure, function, manufacture, and use of the systems and methods disclosed herein. One or more examples of these embodiments are illustrated in the accompanying drawings. Those skilled in the art will understand that the systems, methods, values and sizes specifically described herein and illustrated in the accompanying drawings are non-limiting exemplary embodiments and that the scope of the present invention is defined not solely by the claims. The features illustrated or described in connection with an exemplary embodiment may be combined with the features of other embodiments. Such modifications and variations are intended to be included within the scope of the present invention. A number of problems with conventional methods and systems are noted herein and the methods and systems disclosed herein may address one or more of these problems. By describing these problems, no admission as to their knowledge in the art is intended. A person having ordinary skill in the art will appreciate that, although certain methods and systems are described herein with respect to embodiments of the present invention, the scope of the present invention is not so limited. Moreover, while this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

The invention claimed is:

1. A method for manufacturing glass-based micro- and nanostructure comprising the steps of:
dewetting a thin-film glass layer on a textured substrate to form the micro- and nanostructure.

2. The method of claim 1, wherein the micro- and nanostructure includes at least one of isolated particles of prescribed position and size, a continuous line, a ring, or a percolated structure from a template.

3. The method of claim 1, wherein the micro- and nanostructure includes isolated particles, and wherein the step of dewetting comprises:
tuning a particle size of the isolated particles by changing an initial film thickness or by varying substrate parameters of the textured substrate.

4. The method of claim 1, wherein the micro- and nanostructure includes isolated particles, and wherein the step of dewetting comprises:
tuning a particle size of the isolated particles by successive dewetting of thinner layers.

5. The method of claim 1, wherein the micro- and nanostructure includes isolated particles, and wherein the step of dewetting comprises:
tuning a particle size of the isolated particles by tuning the interparticle gap down to 10 nm through successive dewetting of thin layers.

6. The method of claim 1, further comprising the step of:
forming a quasi-3D structure as the micro- and nanostructure by tuning a substrate lattice of the textured substrate and a thickness of the thin-film glass layer.

7. The method of claim 1, wherein the step of dewetting comprises:
controlling an interplay between Rayleigh instability and spinodal dewetting to form a percolated structure as the micro- and nanostructure.

8. The method of claim 1, further comprising the steps of:
transferring the micro- and nanostructure onto another substrate covered by a transfer resin; and
tuning a particle depth of particles the micro- and nanostructure by tuning a viscosity of the transfer resin.

9. The method of claim 1, further comprising the steps of:
applying a pressure to the thin-film glass layer during the dewetting; and
tuning a lattice constant of the micro- and nanostructures based on the applied pressure of the thin-film glass layer.

10. A method for manufacturing a structure on a substrate, comprising the steps of:
providing a textured substrate;
depositing a thin layer of chalcogenide glass onto the textured substrate; and
annealing the thin layer to induce a dewetting of the textured substrate to break up the thin layer to an array of dispersed and self-ordered nano-objects.

11. The method of claim 10, wherein the micro- and nanostructure includes particles of a prescribed position and size, and wherein a thickness of the thin layer is chosen such that the array of dispersed and self-ordered nano-objects resulting from the annealing imposes a periodicity and a position of the particles of the array, while an amount of material deposited by the thin layer dictates the particle size.

12. The method of claim 10, wherein the step of providing a textured substrate includes processing the substrate by soft lithography to provide the texture.

13. The method of claim 10, wherein the step of providing a textured substrate includes the steps of:
making a silicon mask with a desired pattern;
molding the silicon mask onto a mask substrate; and
imprinting the mask substrate with a negative texture of the silicon mask onto a layer of a substrate to form the textured substrate.

14. The method of claim 13, wherein the step of providing a textured substrate further includes the step of:
imprinting the mask substrate onto a thermoplastic or sol-gel layer.

15. The method of claim 14, wherein the imprinting includes thermal or ultraviolet (UV) nano-imprinting.

16. The method of claim 10, wherein the dispersed and self-ordered nano-objects form elements of a deformation sensor.

17. The method of claim 10, wherein the dispersed and self-ordered nano-objects form field-enhancing metasurfaces for bio-sensing or second harmonic generation.

18. The method of claim 10, wherein the dispersed and self-ordered nano-objects form a phase-controlling metasurfaces for providing Pancharatnam-Berry phase metasurface or a Huygens metasurface.

19. The method of claim 10, wherein the dispersed and self-ordered nano-objects form a highly reflecting array at a selected wavelength.

20. The method of claim 1, wherein the step of dewetting the thin-film glass layer is performed by annealing the thin-film glass layer at or above a glass transition temperature of the thin-film glass layer such that the thin-film glass layer reaches a viscous state.

21. The method of claim 10, wherein the step of annealing the thin layer is performed at or above a glass transition temperature of the thin layer such that the thin layer reaches a viscous state.

* * * * *